United States Patent [19]
Minch et al.

[11] Patent Number: 5,875,126
[45] Date of Patent: Feb. 23, 1999

[54] AUTOZEROING FLOATING GATE AMPLIFIER

[75] Inventors: Bradley A. Minch; Paul E. Hasler, both of Pasadena; Christopher J. Diorio, Torrance; Carver A. Mead, Pasadena, all of Calif.

[73] Assignee: California Institute of Technology, Pasadena, Calif.

[21] Appl. No.: 721,261

[22] Filed: Sep. 26, 1996

Related U.S. Application Data

[60] Provisional application No. 60/004,566 Sep. 29, 1995.

[51] Int. Cl.⁶ .................................................. G11C 16/04
[52] U.S. Cl. .............................. 365/185.01; 365/185.21; 365/185.28; 327/337
[58] Field of Search ........................ 365/185.03, 185.01, 365/185.21, 185.28; 327/337, 50, 58

[56] References Cited

U.S. PATENT DOCUMENTS

| | | | |
|---|---|---|---|
| 4,622,656 | 11/1986 | Kamiya et al. | 365/185 |
| 4,822,750 | 4/1989 | Perlegos et al. | 437/52 |
| 4,935,702 | 6/1990 | Mead et al. | 330/9 |
| 4,953,908 | 9/1990 | Anderson et al. | 357/23.5 |
| 5,059,920 | 10/1991 | Anderson et al. | 330/253 |
| 5,068,622 | 11/1991 | Mead et al. | 330/253 |
| 5,146,106 | 9/1992 | Anderson et al. | 327/50 |
| 5,160,899 | 11/1992 | Anderson et al. | 330/288 |
| 5,166,562 | 11/1992 | Allen et al. | 307/571 |
| 5,331,215 | 7/1994 | Allen et al. | 307/201 |
| 5,336,936 | 8/1994 | Allen et al. | 307/201 |
| 5,345,418 | 9/1994 | Challa | 365/185 |
| 5,463,348 | 10/1995 | Sarpeshkar et al. | 330/253 |
| 5,541,878 | 7/1996 | LeMoncheck et al. | 365/185.03 |
| 5,734,288 | 3/1998 | Dolanzza et al. | 327/337 |

OTHER PUBLICATIONS

A.G. Andreou and K.A. Boahen, "Neural information processing II," in M. Ismail and T. Fiez, eds., Analog VLSI Signal and Information Process, New York: McGraw–Hill, Inc., pp. 358–413, 1994,.

C. Diorio, P. Hasler, B. A. Minch, and C. Mead, "A Single Transistor MOS Device for Long Term Learning," U. S. Serial No. 08/399,966, Mar. 7, 1995;.

C. Diorio, S. Mahajan, P. Hasler, B. Minch, C. Mead, "A High–Resolution Non–Volatile Analog Memory Cell," IEEE Intl. Symp. on Circuits and Systems, vol. 3, pp. 2233–2236, 1995.

P. Gray and R. Meyer, Analysis and Design of Analog Integrated Circuits, Wiley Interscience, 1984;.

P. Hasler, B. A. Minch, C. Diorio, and C. Mead, "An Autozeroing Amplifier Using PFET Hot–Electron Injection", Proceedings of the International Symposium on Circuits and Systems, Atlanta, 1996, III–325–III–328;.

P. Hasler, C. Diorio, B. A. Minch, and C. Mead, "Single Transistor Learning Synapse", Advances in Neural Infomation Processing Systems 7, MIT Press, 1995, pp. 817–824;.

(List continued on next page.)

*Primary Examiner*—Huan Hoang
*Attorney, Agent, or Firm*—D'Alessandro & Ritchie

[57] ABSTRACT

An autozeroing floating-gate amplifier (AFGA) is an integrated continuous-time filter that is intrinsically autozeroing. It can achieve a highpass characteristic at frequencies well below 1 Hz. In contrast with conventional autozeroing amplifiers that eliminate their input offset, the AFGA nulls its output offset. The AFGA is a continuous-time filter; it does not require any clocking. The AFGA includes at least one floating-gate MOS transistor that is capable of hot-electron injection of electrons onto the floating gate of the MOS transistor. Electrons are continuously removed from the floating gate(s), for example, via Fowler-Nordheim tunneling. The AFGA has a stable equilibrium for which this tunneling current is balanced by an injection current of equal magnitude. When the circuit is driven away from its equilibrium by an input or something else, an imbalance between the tunneling and injection current charges (if the tunneling current exceeds the injection current) or discharges (if the injection current exceeds the tunneling current) the floating gate(s) until the equilibrium is re-established. The equilibrium is chosen to achieve a desired baseline of operation.

31 Claims, 20 Drawing Sheets

OTHER PUBLICATIONS

P. Hasler, C. Diorio, B. A. Minch and C. Mead, "Single Transistor Learning Synapse with Long Term Storage," IEEE Intl. Symp. on Circuits and Systems, vol. 3, pp. 1660–1663, 1995;.

C. Hu, S. Tam, F. Hsu, P. Ko, T. Chan, and K. Terrill, Hot–Electron–Induced MOSFET Degradation–Model, Monitor, and Improvement, IEEE Transactions on Electron Devices, vol. ED–32, No. 2, Feb. 1985, pp. 375–385;.

J. Lazzaro, S. Rychebusch, M. A. Mahowald, and C. A. Mead, "Winner–Take–All Networks of O(N) Complexity," in D. S. Touretzky, ed., Advances in Neural Information Processing Systems 1, San Mateo, CA; Morgan Kaufmann, 1989, pp. 703–711;.

J. Lazzaro, et al., "Systems Technologies for Silicon Auditory Models," IEEE Micro, vol. 14, No. 3, 1994, pp. 7–15, T;.

Y. Leblebici and S. M. Kang, Hot–Carrier. Reliability of MOS VLSI Circuits, Kluwer Academic, 1993, pp. 46–49;.

B. A. Minch, C. Diorio, P. Hasler and C. Mead, "A vMOS Soft–Maximum Current Mirror," Proceedings of the 1995 International Symposium on Circuits and Systems, Seattle, WA, vol. 3, pp. 2249–2252;.

B. A. Minch, C. Diorio, P. Hasler, and C. A. Mead, "Translinear Circuits UsingSubthreshold Floating–Gate MOS Transistors," Analog Integrated Circuits and Signal Processing, vol. 9, No. 2 1996, pp. 167–179;.

C. Mead, Analog VLSI and Neural Systems, Addison–Wesley, 1989 (pull relevant part);.

R. Sarpeshkar, T. Delbruck, and C. A. Mead, "White Noise in MOS Transistors and Resistors," IEEE Circuits and Devices, Nov. 1993, pp. 23–29;.

R. Sarpeshkar, R. F. Lyon and C. Mead, "A Low–Power Wide–Linear–Range Transconductance Amplifier," Analog Integrated Circuits and Signal Processing, in Press;.

Y. Tsividis, M. Banu, and J. Khaury, "Continuous–Time MOSFET–C Filters in VLSI", IEEE Transactions on Circuits and Systems, vol. 33, No. 2, 1986, pp. —;.

E. A. Vittoz, "Dynamic Analog Techniques", in Y. Tsividis and P. Antognetti, Design of MOS VLSI Circuits for Telecommunications, Prentice Hall, 1985.

AUTOZEROING FLOATING GATE AMPLIFIER

STATEMENT AS TO RIGHTS TO THE INVENTION

The present invention was made with support from the United States Government under Grant number N00014-89-J-1675 awarded by the Office of Naval Research of the Department of the Navy and under Grant number N00014-89-J-3083 awarded by the Advanced Research Projects Agency of the Department of Defense. The United States Government has certain rights in the invention.

CROSS-REFERENCE TO RELATED APPLICATIONS

This application claims the benefit of U.S. Provisional Patent Application Ser. No. 60/004,566 filed Sep. 29, 1995 in the names of the inventors hereof and commonly assigned herewith.

BACKGROUND OF THE INVENTION

Field of the Invention

The present invention is directed to a bandpass floating-gate amplifier that uses tunneling and pFET hot-electron injection so that the amplifier returns to its sensitive region despite large changes in the DC input voltage.

The Prior Art

Offsets often present a difficult problem for designers of MOS analog circuits. A time-honored tradition for addressing this problem is to use a blocking capacitor to eliminate the input DC component; however, for integrated filters, this approach requires enormous input capacitors and resistors to get time-constants of less than 1 Hz. Existing on-chip autozeroing techniques rely on clocking schemes that compute the input offset periodically and then subtract the correction from the input. See, e.g., E. A. Vittoz, "Dynamic analog techniques", in Y. Tsividis and P. Antognetti, Design of MOS VLSI Circuits for Telecommunications, Prentice Hall, 1985. These autozeroing techniques add significant complexity to the circuit, as well as clock noise, aliasing, and other problems. Accordingly, there is a need for improved autozeroing techniques and apparatus.

Prior floating-gate transistor devices, which utilize electrical charge stored in a floating polysilicon gate imbedded in an insulator such as silicon dioxide, provide a method of storing analog values as a quantity of electrical charge on an integrated circuit chip. The charge on such a floating gate is known to remain fixed for periods of up to many years. Although the advantages of using floating gate transistors as memory elements are well known, J. Lazzaro, et al., "Systems Technologies for Silicon Auditory Models," IEEE Micro, Vol. 14, No. 3, 1994, pp. 7–15, T. Allen, et al., U.S. Pat. No. 5,166,562, entitled: "Writable Analog Reference Voltage Storage Device", they have not been used previously to construct bandpass amplifiers. The principal reason has been the lack of a suitable bi-directional mechanism for writing and erasing the offset. Since the gate of a floating gate transistor is completely embedded within an insulator, writing the memory involves moving charge carriers through this insulator. Two non-light-based mechanisms are known which will move electrons through an insulator. These are tunneling and hot-electron injection. The inherent difficulty in performing these operations has been a primary impediment to the implementation of floating gate transistors in such systems.

Transporting electrons across the barrier presented by the silicon/oxide interface requires that an electron possess more than about 3.1 eV of energy. At room temperature the probability that semiconductor electrons will possess this amount of energy is exceedingly small. Alternatively, an electron could tunnel through this barrier; however, at the voltages and oxide thicknesses used in conventional silicon MOS processing, the tunneling probability is also exceedingly small.

Fowler-Nordheim tunneling involves applying a voltage across the oxide which enhances the probability of an electron tunneling through it. Bi-directional oxide currents are required to achieve a balance of current into or out of a bandpass amplifier. Although the tunneling process has no preferred direction, bidirectional tuneling requires either dual polarity high voltages, or a single polarity high voltage and a means for pulling the floating gate to this voltage when adding electrons, and pulling it near ground when removing them. Both approaches are unattractive. The dual polarity solution requires a negative voltage much lower than the substrate potential; the single polarity solution does not support simultaneous "reading" and "writing".

Single polarity bidirectional tunneling is often used in writing digital EEPROMs. Since writing the memory involves pulling the floating gate either to the supply voltage or to ground, the EEPROM cell cannot be read during the write process. Excess charge is typically added to the floating gate to compensate for this lack of memory state feedback. Although excess charge is acceptable when writing a binary valued "digital" memory, where the exact quantity of charge is irrelevant once it exceeds the amount necessary to completely switch the device to one of its two binary states, uncertainty in the amount of charge applied to an analog device is unacceptable for bandpass amplifier applications.

Hot-electron injection is a process whereby electrons near the surface of a semiconductor acquire more than about 3.1 eV of energy, typically by acceleration in an electric field, and then surmount the silicon/silicon-dioxide barrier. Once in the silicon dioxide conduction band, an electric field applied across the oxide carries these electrons to the floating gate. There are a number of ways of accomplishing hot-electron injection.

One source for a high electric field is a depletion region. For instance, the collector-to-base depletion region of either a vertical or lateral BJT (bipolar junction transistor) can be used. An example of a lateral BJT used in a similar application is shown in U.S. Pat. No. 4,953,928 to Anderson, et al. Alternatively, the channel-to-drain depletion region of a high-threshold N-type MOSFET in a moderately doped substrate can be used. An example of such a device used in a similar application is shown in U.S. patent application Ser. No. 08/399,966 filed on Mar. 7, 1995 by Diorio, et al. Finally, the drain-to-channel depletion region of a subthreshold P-type MOSFET can be used. Hot-electron injection in such devices is usually thought of as a source of oxide degradation in MOSFETs, Y. Leblebici and S. M. Kang, Hot Carrier Reliability of MOS VLSI Circuits, Kluwer Academic, 1993. Nonetheless, this process can be reliably and safely used as a mechanism to adapt the charge stored on a floating-gate MOSFET as shown herein.

Another source for a high electric field is the channel region of a split-gate N-type MOSFET. Split-gate injectors, as shown and described in U.S. Pat. No. 4,622,656 to Kamiya, et al., contain two partially overlapping gate regions at very different voltages. The resulting surface potential drops abruptly at the interface between the two gates, creating a high electric field localized in this small region of the transistor channel.

SUMMARY OF THE INVENTION

The present invention is directed to a novel device known as an autozeroing floating-gate amplifier (AFGA). The AFGA is an integrated continuous-time filter that is intrinsically autozeroing. It can achieve a highpass characteristic at frequencies well below 1 Hz. In contrast with conventional autozeroing amplifiers that eliminate their input offset, the AFGA nulls its output offset. The AFGA is a continuous-time filter; it does not require any clocking. According to the invention, an AFGA includes at least one floating-gate MOS transistor that is capable of hot-electron injection of electrons onto the floating gate of the MOS transistor. Electrons are continuously removed from the floating gate(s), for example, via Fowler-Nordheim tunneling. The AFGA has a stable equilibrium for which this tunneling current is balanced by an injection current of equal magnitude. When the circuit is driven away from its equilibrium by an input or something else, an imbalance between the tunneling and injection current charges (if the tunneling current exceeds the injection current) or discharges (if the injection current exceeds the tunneling current) the floating gate(s) until the equilibrium is re-established. The equilibrium is chosen to achieve a desired baseline of operation.

OBJECTS AND ADVANTAGES OF THE INVENTION

An object and advantage of the present invention is to provide an autozeroing floating-gate amplifier.

Another object and advantage of the present invention is to provide a band pass floating-gate amplifier implemented in an analog MOS circuit and capable of automatically returning to its sensitive regime despite large changes in its DC inputs.

Another object and advantage of the present invention is to provide improved autozeroing photoreceptor circuits.

Another object and advantage of the present invention is to provide improved autozeroing sensor input circuits.

Another object and advantage of the present invention is to provide an autozeroing differentiator circuit.

Another object and advantage of the present invention is to provide a tunable, autozeroing second-order filter which can be cascaded to form silicon cochleas.

Another object and advantage of the present invention is to provide improved winner-take-all (WTA) circuits.

Another object and advantage of the present invention is to provide autozeroing floating-gate MOS translinear circuits.

Yet another object and advantage of the present invention is to provide an autozeroing, first-order log-domain filter.

These and many other objects and advantages of the present invention will become apparent to those of ordinary skill in the art from a consideration of the drawings and ensuing description of the invention.

BRIEF DESCRIPTION OF THE DRAWINGS

FIG. 11A shows the small-signal AFGA model using the small-signal pFET model.

FIG. 13A shows the output noise spectrum of an AFGA with a gain of 146 for two different tunneling voltages ($V_{tun}$). FIG. 13B shows a comparison of a high-gain AFGA with a unity gain AFGA and a generic follower-connected differential amplifier. All three amplifiers had the same $V_t$ voltage, and correspondingly had the same bias current. The sum of $C_1$ and $C_2$ is the same for both AFGAs.

FIG. 17A shows a top plan view of an AFGA device. FIG. 17B shows a vertical cross-sectional view of the AFGA taken along line 17B—17B of FIG. 17A.

FIG. 18A utilizes a phototransistor and FIG. 18B utilizes a photodiode.

DESCRIPTION OF THE PREFERRED EMBODIMENTS

Those of ordinary skill in the art will realize that the following description of the present invention is illustrative only and is not intended to be in any way limiting. Other embodiments of the invention will readily suggest themselves to such skilled persons from an examination of the within disclosure.

Structure of the AFGA

Figure 1:
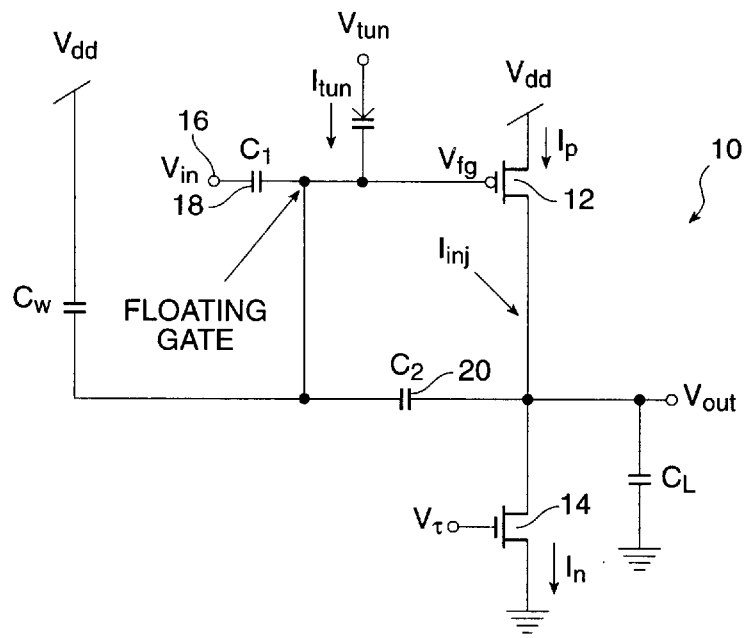
FIG. 1 is an electrical schematic diagram of an autozeroing floating-gate amplifier (AFGA) that uses pFET hot-electron injection.

FIG. 1 is an electrical schematic diagram of an autozeroing floating-gate amplifier (AFGA) 10 that uses pFET hot-electron injection according to a presently preferred embodiment of the present invention. Until now, pFET hot-electron injection has attracted attention only as a source of MOSFET oxide degradation, Y. Leblebici and S. M. Kang, Hot Carrier Reliability of MOS VLSI Circuits, Kluwer Academic, 1993, therefore this circuit presents an interesting case of "turning a bug into a feature." The capacitance from the floating gate to ground, $C_w$, represents both the parasitic and the explicitly drawn capacitances. Increasing $C_w$ will increase the linear input range of the circuit. The capacitance connected to the output terminal, $C_L$, is the load capacitance. Between $V_{tun}$ and $V_{fg}$ is the symbol used herein for a tunneling junction, which is a capacitor between the floating-gate and an n-well. The open-loop inverting amplifier consists of a pFET input transistor 12, and an nFET current source 14 which sets the current through pFET 12. With capacitive feedback, the input signal on line 16 is amplified by a closed-loop gain approximately equal to $$-\frac{C_1}{C_2}$$

where $C_1$ is the value of capacitor 18 and $C_2$ is the value of capacitor 20. The maximum gain is limited both by the open-loop gain, and by the parasitic floating-gate-to-drain overlap capacitance.

The complementary tunneling and hot-electron injection processes adjust the floating-gate charge in such a way that the amplifier's output voltage returns to a steady-state value on a slow time scale (on the order of a second or longer) when the injection current is equal to the tunneling current. If the output voltage is below its equilibrium value, then the injection current exceeds the tunneling current, decreasing the charge on the floating gate; that, in turn, increases the output voltage back toward its equilibrium value. If the output voltage is above its equilibrium value, then the tunneling current exceeds the injection current, increasing the charge on the floating gate; that, in turn, decreases the output voltage back toward its equilibrium value. The circuit behaves like a high-pass filter with a long ($\geq 1$ second) time constant. The time constant may be set to be arbitrarily long (e.g., minutes, hours, days, etc.)

A Qualitative Presentation of AFGA Operation

Two conditions must be satisfied for the circuit to be in equilibrium. First, the pFET channel current, $I_p$, must be equal to the nFET channel current $I_n$. The quiescent channel current is defined as $I_{s0}$. Second, the injection gate current must be equal to the tunneling current. The quiescent injection current is defined as $I_{inj0}$ in which must equal $I_{tun0}$, the quiescent tunneling current, at equilibrium. Since the tunneling and injection currents are many orders of magnitude smaller than $I_{s0}$ and are charging similarly-sized capacitances, the first condition is satisfied much faster than is the second condition. The frequency range over which the first condition is satisfied, but the second condition is not satisfied, is where the AFGA behaves as an amplifier. The combination of electron tunneling and pFET hot-electron injection applies the appropriate negative feedback to stabilize the output voltage such that the second condition is also satisfied.

In the frequency range where the first condition does not hold, the output voltage is attenuated. In this regime, the circuit behaves as a low-pass filter. Since the output capacitances are charged or discharged by currents on the scale of $I_{s0}$, the cutoff frequency will be directly dependent on the bias current. Continuous-time integrators operate on a similar principle, Y. Tsividis, M. Banu, and J. Khaury, "Continuous-time MOSFET-Cfilters in VLSI", *IEEE Transactions on Circuits and Systems*, Vol. 33, No. 2, 1986 and C. Mead, *Analog VLSI and Neural Systems*, Addison-Wesley, 1989. The AFGA transfer function is bandpass, with the low-frequency cutoff set by the equilibrium tunneling and injection currents, and the high-pass cutoff independently set by the equilibrium pFET and nFET channel currents.

Figure 2:
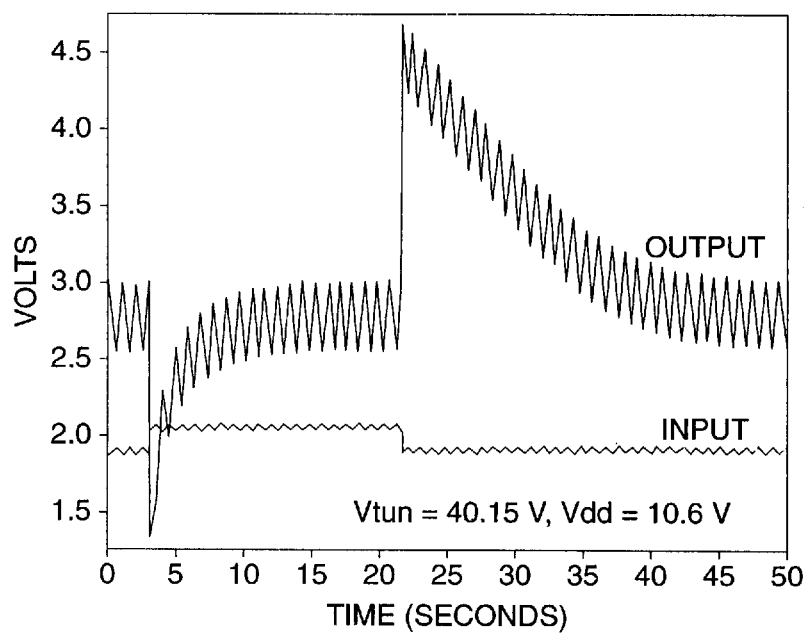
FIG. 2 is a voltage vs. time response of the AFGA to a 1 Hz sinewave superimposed on a 19s voltage pulse. The AFGA has a closed-loop gain of 11.2, and a low-frequency cutoff at 100 mHz.

FIG. 2 shows the response of the AFGA to a 1 Hz sinewave superimposed on a 19s input voltage pulse. The AFGA has a closed-loop gain of 11.2, and a low-frequency cutoff at 100 mHz.

If the input changes on a timescale that is much faster than the adaptation, then the output is an amplified version of the input signal. The amplifier adapts to the pulse input after an initial transient, while preserving the amplified 1 Hz sine wave.

The AFGA devices discussed herein were fabricated in the 2-micron n-well Orbit CMOS process available through MOSIS. Typical operating values for $V_{tun}$ were between 33 V and 42 V; those for $V_{dd}$ were between 6 V and 12 V. Similar data have been obtained with the 1.2-micron n-well Orbit CMOS process, but with typical operating values for $V_{tun}$ between 26 V and 31 V. For more modem processes, the typical operating voltages will decrease, because of thinner gate oxides and higher dopant impurity concentrations. Those of ordinary skill in the art will realize that any number of commercially available process technologies may also be used.

Circuit Model of a pFET With Hot-Electron Injection and Electron Tunneling

Before considering the behavior of the autozeroing amplifier, we first review electron tunneling and pFET hot-electron injection. We begin with the basic subthreshold MOS characteristics, C. Mead, *Analog VLSI and Neural Systems*, Addison-Wesley, 1989, which are valid even at large drain-to-source voltages. For subthreshold operation, the change in the nFET channel current for a change in gate voltage, $\Delta V_g$, around a bias current, $I_{s0}$, can be described as:

$$I_n = I_{s0} \exp\left(\frac{\kappa_n \Delta V_g}{U_T}\right) \quad \text{(EQ. 1)}$$

where $\kappa_n$ is the fractional change in the nFET surface potential due to a change in $\Delta V_g$, and $U_T$ is the thermal voltage, $$\frac{kT}{q}.$$

The channel current of a pFET is described by:

$$I_p = I_{s0} \exp\left(\frac{-\kappa \Delta V_g}{U_T}\right) \quad \text{(EQ. 2)}$$

where $\kappa$ is the fractional change in the pFET surface potential due to a change in $\Delta V_g$. Following the conventional definitions of small-signal transconductance, $g_m$, and output resistance, $r_o$, P. Gray and R. Meyer, *Analysis and Design of Analog Integrated Circuits*, Wiley Interscience, 1984, one obtains the following transconductance and output resistance relationships for a subthreshold pFET:

$$g_m = \frac{\kappa I_{s0}}{U_T}, \text{ and } r_o = \frac{V_o}{I_{s0}} \quad \text{(EQ. 3)}$$

Figure 3:
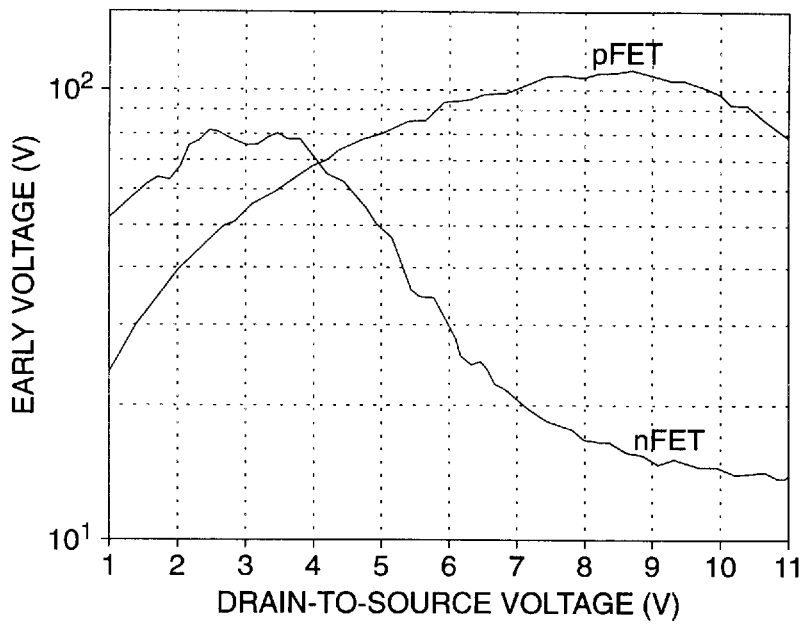
FIG. 3 shows the effect of drain-to-source voltage on the Early voltage of an nFET and pFET.

FIG. 3 shows how the Early voltage, $V_o$, changes when the FETs (both nFETs and pFETs) operate with large drain-to-source voltages. The Early voltage is directly related to the amplifier's open-loop gain; for this amplifier, the maximum open-loop gain is roughly 200. The Early voltage decreases at large drain-to-source voltages due to impact ionization in the drain-to-channel depletion region, and holes are accelerated to large energies; if a hole has an energy larger than the bandgap, then it may undergo impact-ionization. The result of an impact ionization is two holes and one electron. For the nFET biased with a drain-to-source voltage of 3.0 V and the pFET biased with a drain-to-source voltage of 8.5 V, $V_o$ is nearly constant for both transistors; therefore the AFGA's open-loop gain also is nearly constant.

Figure 4A:
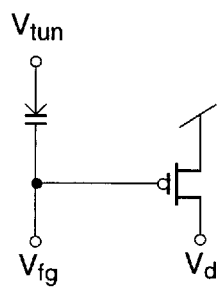
FIGS. 4A and 4B depict a small-signal model of a pFET with the effects of hot-electron injection.
Figure 4B:
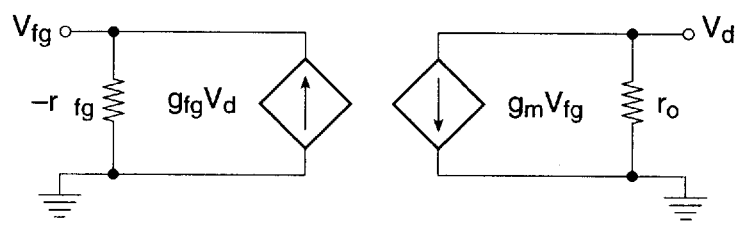

FIGS. 4A and 4B depict a small-signal model of a pFET with the effects of hot-electron injection. Here a constant tunneling current at the floating gate ($V_{fg}$) is assumed; this tunneling current sets the bias point for the hot-electron injection parameters.

A. Electron Tunneling

Increasing the tunneling voltage, $V_{tun}$, increases the effective electric field across the oxide, which increases the probability of the electron tunneling through the barrier. Typical values for the oxide field range from 0.75 V/nm to 1.0 V/nm. The classic model of electron tunneling through a silicon/silicon-dioxide system, M. Lenzlinger and E. H. Snow (1969), "Fowler-Nordheim tunneling into thermally grown $SiO_2$," *J. Appl. Phys.*, vol. 40, pp. 278–283, 1969, models the electron tunneling current by:

$$I_{tun} = I_o \exp\left(\frac{E_o}{E_{ox}}\right) = I_o \exp\left(\frac{t_{ox} E_o}{V_{tun} - V_{fg}}\right) \quad \text{(EQ. 4)}$$

where $E_{ox}$ is the oxide electric field, $t_{ox}$ is the oxide thickness, and $E_o$ is a device parameter that is roughly equal to 25.6 V/nm, is the starting point of the analysis. C. Mead, "Scaling of MOS Technology to Submicrometer Feature Sizes", Journal of VLSI Signal Processing, 8, pp. 9–25, 1994. As showed in P. Hasler, C. Diorio, B. A. Minch and C. Mead, "Single Transistor Learning Synapses", Advances in Neural Information Processing Systems 7, MIT Press, pp. 817–824, 1995. The tunneling current for a fixed bias on the tunneling line is approximated by:

$$I_{tun} = I_{tun0} e^{\frac{\Delta V_{tun} - \Delta V_{fg}}{V_x}} \quad \text{(EQ. 5)}$$

where $V_x$ is a parameter related to the quiescent tunneling and floating-gate voltages, $\Delta V_{tun}$ is the change in the tunneling voltage, and $\Delta V_{fg}$ is the change in the floating-gate voltage from the quiescent floating-gate voltage. For the operating conditions discussed herein, a typical value of $V_x$ is 1 V with the 42 nm oxide used in the 2-micron n-well Orbit process from MOSIS.

B. Hot Electron Injection

Figure 5A:
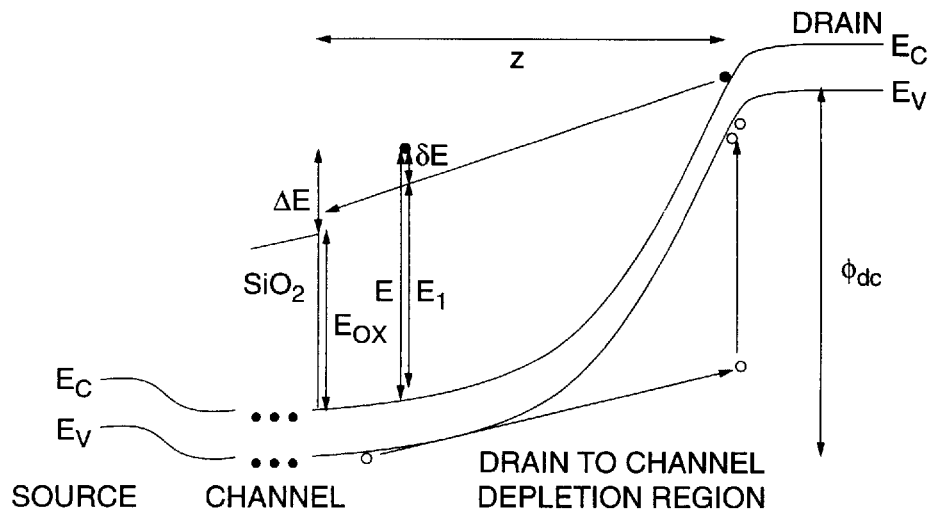
FIG. 5A is a band diagram of a subthreshold pFET transistor under conditions favorable for hot-electron injection.

FIG. 5A is a band diagram of a subthreshold pFET transistor operating under bias conditions that are favorable for hot-electron injection. Hot-hole impact ionization creates electrons at the drain edge of the drain-to-channel depletion region, due to the high electric fields there. These electrons travel back into the channel region, gaining energy as they go. When their kinetic energy exceeds that of the silicon/silicon-dioxide barrier, they can be injected into the oxide and transported to the floating gate. The hole impact-ionization current is proportional to the pFET source current, and is the exponential of a smooth function ($f_1$) of the drain-to-channel potential ($\Phi_{dc}$). This relationship may be expressed:

$$I_{impact} = I_p e^{f_1(\Phi_{dc})} \quad \text{(EQ. 6)}$$

where $\Phi_{dc}$ is the potential drop from channel to drain. The injection current is proportional to the hole impact-ionization current, and is the exponential of another smooth function ($f_2$) of the voltage drop from channel to drain. This relationship may be expressed:

$$I_{inj} = I_{impact} e^{f_2(\Phi_{dc})} \quad \text{(EQ. 7)}$$

Because the injection current is only a weak function of the floating-gate voltage for a fixed source current ($I_p$) and $\Phi_{dc}$, the gate-voltage dependence may be neglected for this application.

Figure 5B:
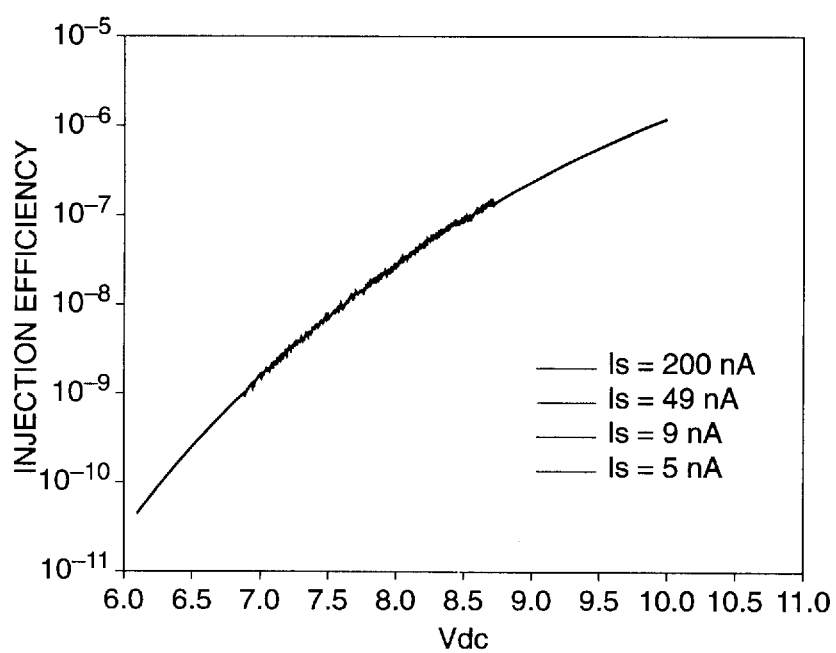
FIG. 5B is measured data of pFET injection efficiency verses the drain-to-channel voltage for four source currents.

FIG. 5B shows measured pFET injection efficiency for several source currents ($I_s$=200 nA, 49 nA, 9 nA, 5 nA). Injection efficiency is the ratio of the injection current to source current. The injection efficiencies are nearly identical for the different source currents; therefore, they appear to be indistinguishable on the plot of FIG. 5B.

The functions $f_1$ and $f_2$ are approximately linear over a 1 to 2 V change in $\Phi_{dc}$. With this linear approximation, the hot-electron injection current may be expressed:

$$I_{inj} = I_{inj0} \frac{I_p}{I_{s0}} \exp\left(\frac{-\Delta\Phi_{dc}}{V_{inj}}\right) \quad \text{(EQ. 8)}$$

where $\Delta\Phi_{dc}$ is the change in $\Phi_{dc}$ from the quiescent level, and $V_{inj}$ is a measurable device parameter. For a quiescent $\Phi_{dc}$=8.2 V, a typical value for $V_{inj}$ is 250 mV. A decreasing input signal will decrease the pFET surface potential via capacitive coupling to the floating gate. Decreasing the pFET surface potential will increase the source current, thereby decreasing $\Phi_{dc}$ for a fixed output voltage, and lowering the injection efficiency. Consequently as derived in P. Hasler, C. Diorio, B. A. Minch, and C. Mead, "Single Transistor Learning Synapses", Advances in Neural Information Processing Systems 7, MIT Press, pp. 817–824, 1995, the injection current may be modelled as the $\alpha$ power of the source current as follows:

$$\begin{aligned} I_{inj} &= I_{inj0} \left(\frac{I_p}{I_{s0}}\right)^\alpha \exp\left(\frac{-\Delta V_d}{V_{inj}}\right) \\ &= I_{inj0} \exp\left(-\frac{\alpha\kappa\Delta V_{fg}}{U_T} - \frac{\Delta V_d}{V_{inj}}\right) \end{aligned} \quad \text{(EQ. 9)}$$

where $I_{s0}$ is the quiescent source current, $V_d$ is the drain voltage, and $\alpha$ is $$1 - \frac{U_T}{V_{inj}}.$$

A typical value of $\alpha$ is 0.90, which is consistent with $V_{inj}$ equal to 250 mV.

The small-signal quantities $g_{fg}$ and $r_{fg}$ which are both shown in FIG. 4B can now be expressed, using EQ. 5 and EQ. 9. The term $g_{fg}$ is defined as the change in the gate current in response to a change in drain voltage. Because only the injection current depends upon the drain voltage, $$g_{fg} = \frac{I_{tun0}}{V_{inj}}.$$

The term $r_{fg}$ is defined for a pFET as the negative change in gate current for a change in gate voltage. Because the effects of both the tunneling and the hot-electron injection processes need to be included, the model for $$r_{fg} \text{ is } \frac{U_T/\kappa\| - V_x}{I_{tun0}}, \text{ where } x\|y = \frac{xy}{x+y}.$$

Equilibrium Voltages of the AFGA

Qualitatively, two factors change the steady-state output voltage. For the injection current to match the tunneling current after a change in $V_\tau$ or $V_{tun}$, the output voltage must reach a new equilibrium. Increasing the bias voltage or channel current requires an increase in the output voltage, because the pFET must reduce its injection efficiency so that the injection current matches the original tunneling current. Increasing the tunneling voltage, which increases the steady-state tunneling current, requires a decrease in the output voltage, because the pFET must increase its injection efficiency so that the injection current matches the new tunneling current.

Above, two conditions for equilibrium were postulated; they are now described quantitatively. Assuming an initial operating point, and considering changes in the steady-state output voltage in response to a change in $V_\tau$ or in $V_{tun}$, the current in the nFET must be equal to the current in the pFET:

$$I_n = I_p \quad \text{(EQ. 10)}$$

$$I_{so}\exp\left(\frac{\kappa_n \Delta V_\tau}{U_T}\right) = I_{so}\exp\left(\frac{-\kappa\Delta V_{fg}}{U_T}\right)$$

where $\Delta V_{96}$ is the change in the bias voltage, and $\Delta V_{fg}$ is the change in the pFET's floating-gate voltage. Therefore, the following relation is obtained:

$$\Delta V_{fg} = -\frac{\kappa_n}{\kappa} \Delta V_\tau \quad \text{(EQ. 11)}$$

Qualitatively, the bias current in the nFET sets the current in the pFET, and therefore sets the floating-gate voltage.

Second, the tunneling current must be equal to the injection current:

$$I_{inj0}\exp\left(\frac{-\alpha\kappa\Delta V_{fg}}{U_T}\right)\exp\left(\frac{-\Delta V_{out}}{V_{inj}}\right) = \quad \text{(EQ. 12)}$$

$$I_{tun0}\exp\left(\frac{\Delta V_{tun} - \Delta V_{fg}}{V_x}\right)$$

Here, if it is assumed that $I_{inj0}$ is equal to $I_{tun0}$ at the initial operating point, the second equilibrium relationship is obtained:

$$\Delta V_{out} = -\frac{V_{inj}}{V_x} \Delta V_{tun} + V_{inj}\frac{\kappa_n}{\kappa}\left(\frac{\alpha\kappa}{U_T} - \frac{1}{V_x}\right)\Delta V_\tau \quad \text{(EQ. 13)}$$

For above-threshold operation, the above equation becomes $$\Delta V_{out} = \quad \text{(EQ. 14)}$$

$$-\frac{V_{inj}}{V_x}\Delta V_{tun} + V_{inj}\frac{\kappa_n}{\kappa}\left(\frac{2}{V_{dd} - V_{fg} + V_T} - \frac{1}{V_x}\right)\Delta V_\tau$$

Figure 6A:
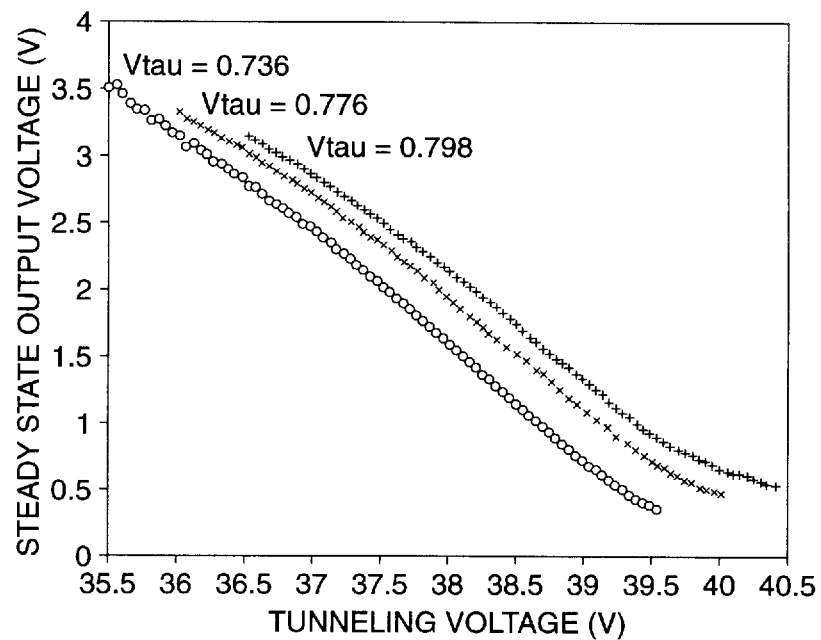
FIG. 6A shows the steady-state output voltage versus the tunneling voltage in an AFGA for three values of $V_r$.
Figure 6B:
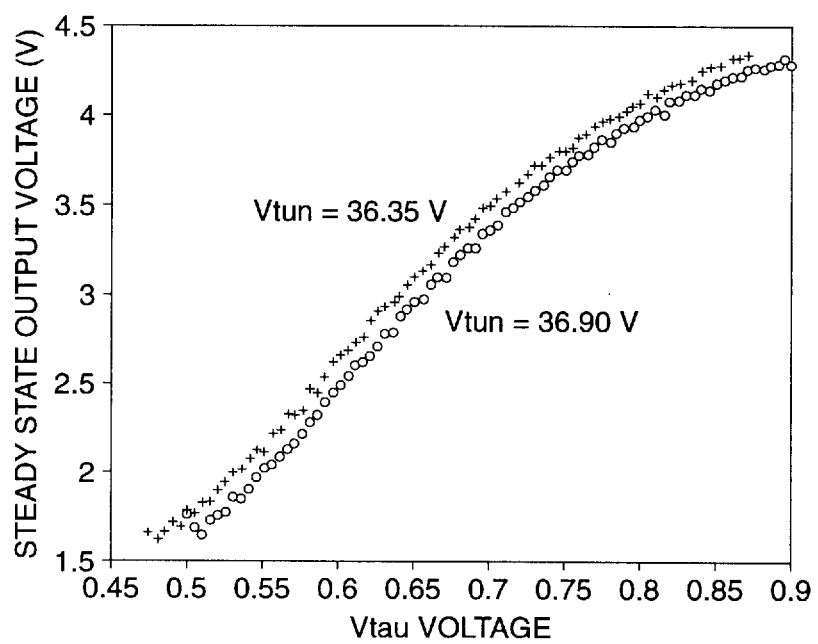
FIG. 6B shows the steady-state output voltage versus $V_t$ in an AFGA for two tunneling voltages.

FIGS. 6A–6B show the measured change in the steady-state output voltage versus circuit parameters. Both data sets agree with the model described in EQ. 13. The AC gain of this amplifier was 146. FIG. 6A shows the steady-state output voltage versus the tunneling voltage for three values of $V_\tau$. FIG. 6B shows the steady-state output voltage versus $V_\tau$ for two tunneling voltages (36.35 V, 36.9 V). The curves begin to saturate for above-threshold bias currents, as predicted by EQ. 14.

An ideal amplifier is insensitive to variations in the bias voltages; the data in FIGS. 6A–6B show the circuit's DC sensitivity to $V_\tau$ and $V_{tun}$. First, the DC gain from the tunneling node to the output is given by $$\frac{V_{inj}}{V_x},$$

which, for the measured data shown, is 0.64. The DC gain from the nFET gate to the output is given by $$V_{inj}\frac{\kappa_n}{\kappa}\left(\frac{\alpha\kappa}{U_T} - \frac{1}{V_x}\right),$$

which, for the measured data shown, is 10. The DC gain from the input to the output is zero. All three gains are smaller than the AFGA AC gain of 146.

Under the proper bias conditions, the power-supply rejection depends on the choice of reference. With the input and output referred to $V_{dd}$, and with $V_\tau$ referred to GND, the AFGA gain from the power-supply to the output is 0.1, which results in a passband power-supply rejection ratio of 64 dB. The power-supply rejection ratio is limited by the open-loop gain of the amplifier. If instead all nodes are referred to GND, the AC power supply gain is 146, which decreases the passband power-supply rejection ratio to 0 dB. The circuit designer must also be careful of where the floating-gate capacitances are connected; for good power supply rejection, all these capacitors must be referenced to $V_{dd}$. Otherwise, the power supply becomes another input to the AFGA and any AC power supply noise will appear at the output, amplified by the AFGA's AC gain.

The steady-state output voltage and the high-pass cut-off frequency are set explicitly by $V_{tun}$ and by the power-supply voltage. Increasing $V_{tun}$ increases the tunneling current, which in turn decreases the settling time, but it also decreases the steady-state output voltage, since the pFET must have a larger drain-to-source voltage. Increasing the power-supply voltage decreases the tunneling current by decreasing the voltage across the oxide, increasing the settling time and increasing the steady-state output voltage.

Low Frequency AFGA Behavior

Two general equations can be written which govern the autozeroing floating-gate amplifier behavior around an equilibrium output voltage. The first equation is obtained by applying Kirchoff's current law (KCL) at the floating gate:

$$(C_1 + C_2 + C_w)\frac{dV_{fg}}{dt} = C_1\frac{dV_{in}}{dt} + C_2\frac{dV_{out}}{dt} + I_{tun0}\left(1 - \exp\left(-\alpha\frac{\kappa \Delta V_{fg}}{U_T} - \frac{\Delta V_{out}}{V_{inj}}\right)\right) \quad \text{(EQ. 15)}$$

The second equation is obtained by applying KCL at the output node:

$$(C_2 + C_L)\frac{dV_{out}}{dt} = C_2\frac{dV_{fg}}{dt} + I_\tau\left(\exp\left(-\frac{\kappa \Delta V}{U_T}\right) - 1\right) \quad \text{(EQ. 16)}$$

This neglects the Early effect, which adds a correction term to EQ. 16. As long as the closed-loop gain is much lower than the amplifier gain, ignoring the Early effect is a good approximation.

In the passband, where the AFGA is an amplifier, the floating gate is held nearly fixed by the amplifier feedback, and the tunneling and injection currents are negligible. This approximation simplifies EQ. 15 to $$C_2\frac{dV_{out}}{dt} = -C_1\frac{dV_{in}}{dt} \quad \text{(EQ. 17)}$$

thus, the change in the output voltage ($\Delta V_{out}$) is equal to the input voltage ($\Delta V_{in}$) amplified by $$-\frac{C_1}{C_2}.$$

A. Low-Frequency Model

Two approximations are made here to model the low frequency response of the AFGA. First, the open-loop gain from the floating gate to the output can be large; a typical value is 700. To keep the output voltage between the supply rails, the floating gate voltage is confined to a 10 mV swing. Thus, the floating-gate voltage is approximated by a constant value. Second, because the floating-gate voltage is nearly constant, the source current varies only slightly. The quiescent source current ($I_{s0}$) is set by the nFET current source. From EQ. 5 and EQ. 9, the model of injection current for a fixed source current $I_{s0}$ is therefore:

$$I_{tun} - I_{inj} = I_{tun0}\left(1 - \exp\left(-\frac{\Delta V_{out}}{V_{inj}}\right)\right) \quad \text{(EQ. 18)}$$

where $I_{tun0}=I_{inj0}$ for the circuit in equilibrium. Since the floating gate is held nearly constant by feedback, the floating-gate voltage dependence in EQ. 9 is negligible. Even when the circuit is biased with above-threshold currents, the tunneling current still is nearly fixed. Since the injection efficiency is still an exponential function of the drain voltage for above-threshold currents, the low-frequency dynamics are similar in below- and above-threshold operation.

With the above approximations, the amplifier's output voltage, $V_{out}$, can be modeled in terms of $V_{in}$, with a single equation. The total floating-gate current is the sum of the capacitive currents of the input and output terminals, plus the tunneling and injection currents. From EQ. 15:

$$C_2\frac{dV_{out}}{dt} = -C_1\frac{dV_{in}}{dt} + I_{tun0}\left(\exp\left(-\frac{\Delta V_{out}}{V_{inj}}\right) - 1\right) \quad \text{(EQ. 19)}$$

To solve EQ. 19, make the following change of variables:

$$X = e^{\frac{\Delta V_{out}}{V_{inj}}} \quad \text{(EQ. 20)}$$

The resulting equation for X is a linear, first-order differential equation with variable coefficients $$\tau_l\frac{dX}{dt} = -\frac{\tau_l A_v X}{V_{inj}}\frac{dV_{in}}{dt} + 1 - X \quad \text{(EQ. 21)}$$

where $\tau_l$, the low-frequency cutoff, is equal to $$\frac{C_2 V_{inj}}{I_{tun0}},$$

and $A_v$ is the closed-oop AC gain of the amplifier, $$-\frac{C_1}{C_2}.$$

B. Response to a Voltage Step

Consider the AFGA's response to an input voltage step. Assume that the output voltage has adapted initially to its steady-state value. To solve EQ. 21, first assume that the output voltage immediately after applying the step, $\Delta V_{out}$ (0$^+$), is given by the magnitude of the input step times the AFGA AC gain. Employing $\Delta V_{out}(0^+)$ as a new, effective initial condition, and denoting the effective initial condition in X by:

$$X(0^+) = \exp\left(\frac{V_{out}(0^+)}{V_{inj}}\right) \quad \text{(EQ. 22)}$$

For a downward step, X(0$^+$) is greater than 1; for an upward step, X(0+) is less than 1. After the input step, $$\frac{dV_{in}}{dt} = 0;$$

therefore EQ. 21 becomes:

$$\tau_l \frac{dX}{dt} = 1 - X \quad \text{(EQ. 23)}$$

$$X(0) = X(0^+)$$

The solution to EQ. 23 in terms of $\Delta V_{out}$ is $$\Delta V_{out}(t) = V_{inj} \ln\left(1 + (X(0^+) - 1)\exp\left(\frac{-t}{\tau_l}\right)\right) \quad \text{(EQ. 24)}$$

where $\Delta V_{out} \to 0$ as $t \to \infty$.

The step response has three interesting regimes, which are approximated by $$\Delta V_{out}(0^+) \exp\left(\frac{-t}{\tau_l}\right) \quad X(0^+) \approx 1 \quad \text{(EQ. 25)}$$

$$\Delta V_{out} \approx \Delta V_{out}(0^+) - \frac{I_{tun0}}{C_2} t \quad X(0^+) \gg 1$$

$$\Delta V_{inj} \ln\left(X(0^+) + \frac{t}{\tau_l}\right) \quad X(0^+) \ll 1$$

The first case occurs when the tunneling current is nearly equal to the injection current just after the voltage step. The solution in this region is the familiar exponential decay of a linear system. The second case occurs when the tunneling current dominates the injection current. The behavior of the output voltage in this regime results from the constant tunneling current removing electrons from the floating gate. The third case occurs when the injection current dominates the tunneling current.

Figure 7A:
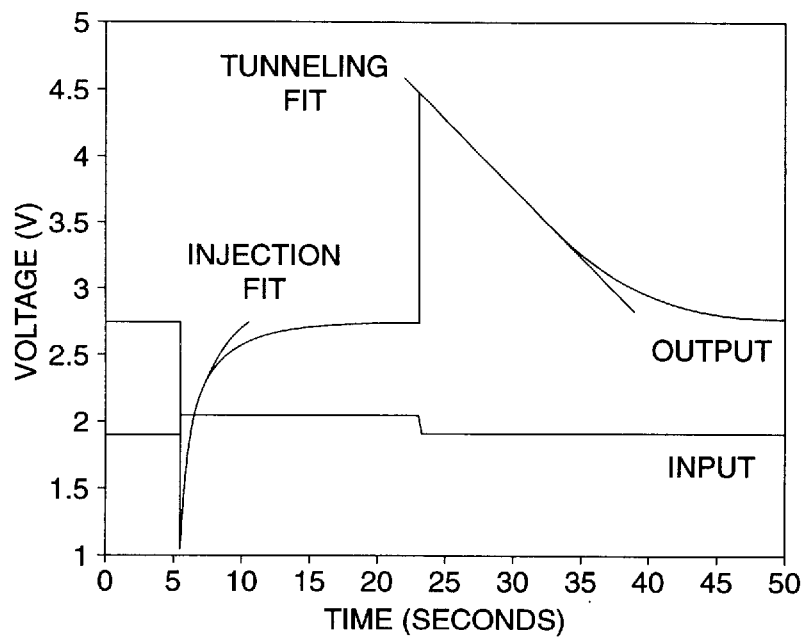
FIGS. 7A–7B shows the response of an AFGA to an upgoing and downgoing step input. The adaptation in response to an upward step results from electron tunneling; the adaptation in response to a downward step results from pFET hot-electron injection.
Figure 7B:
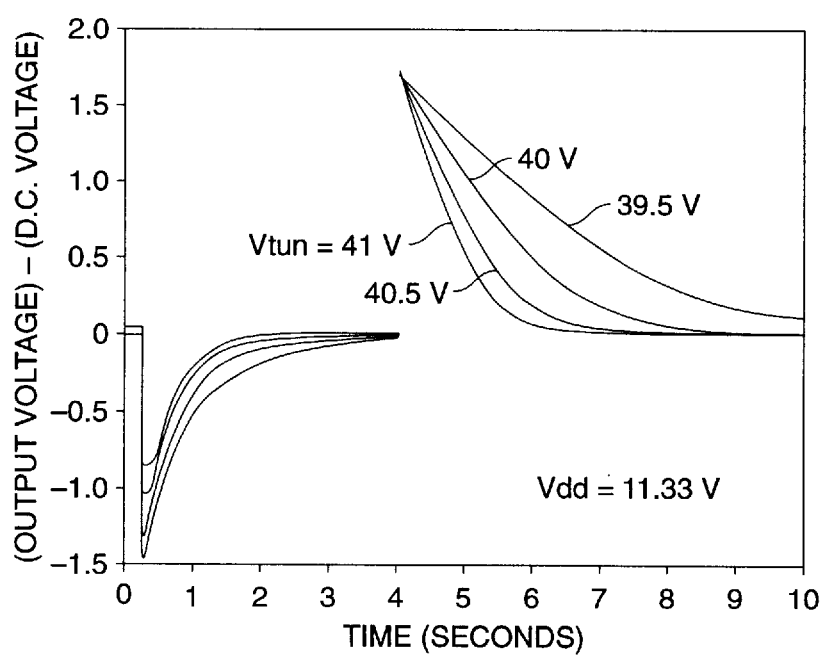

FIGS. 7A–7B shows the response of the AFGA to an upgoing and downgoing step input. The adaptation in response to an upward step results from electron tunneling; the adaptation in response to a downward step results from pFET hot-electron injection. This amplifier had a gain of 11.2. FIG. 7A shows a plot of the curve fits of the simplified expressions of EQ. 25, where either tunneling or injection dominates the restoration process. From the fits, $\tau_l$ is 4.3s and $I_{tun0}$ is 50 $fA$. The value of $\tau_l$ can be set reliably to more than $10^5$ seconds. FIG. 7B shows the response to a square wave for four different values (41 V, 40.5 V, 40 V, 39.5 V) of the tunneling voltage. This amplifier of FIG. 7B had a gain of 147; the input square wave is not shown. The steady-state output voltage decreased in the same manner as seen in FIG. 6B for increasing tunneling voltages. The initial tail in the upgoing response is due to the output voltage going to ground. FIG. 7A shows a measured response to an input pulse, with curve fits to the regions where either the tunneling or injection current dominates.

C. Long-Term Parameter Drift

The physical properties of the tunneling and hot-electron injection mechanisms change with time. These processes are permanently modified as electrons pass through the oxide, creating electron traps. The long-term changes were investigated by performing an accelerated stress experiment, where an AFGA was continuously operated for 145 hours with an average $\tau_l$ of 1.7s. When used as an amplifier or as a low-pass filter, a more reasonable $\tau_l$ would be at least several minutes; therefore, this experiment is equivalent to the stress of operating the AFGA continuously for a few years. The effect of an input signal only slightly modifies the results of this experiment. To characterize the behavior of the AFGA over time, a similar square wave experiment to the one shown in FIGS. 7A–7B was performed once per hour for 145 hours. To each of the resulting output waveforms, the expressions of EQ. 25 were fit and the relevant device parameters were extracted.

Figure 8A:
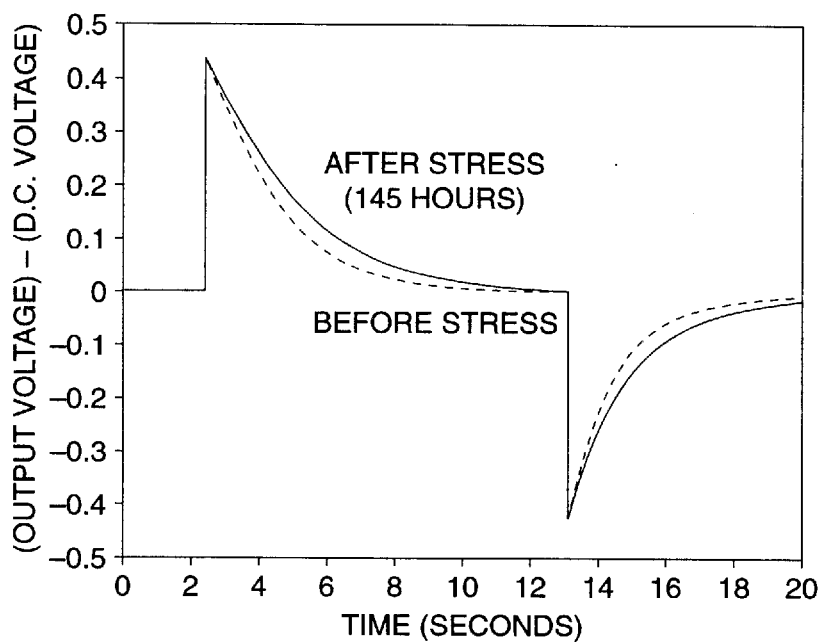
FIG. 8A shows the response of an AFGA to an upgoing and downgoing voltage step before and after 145 hours of operation.
Figure 8B:
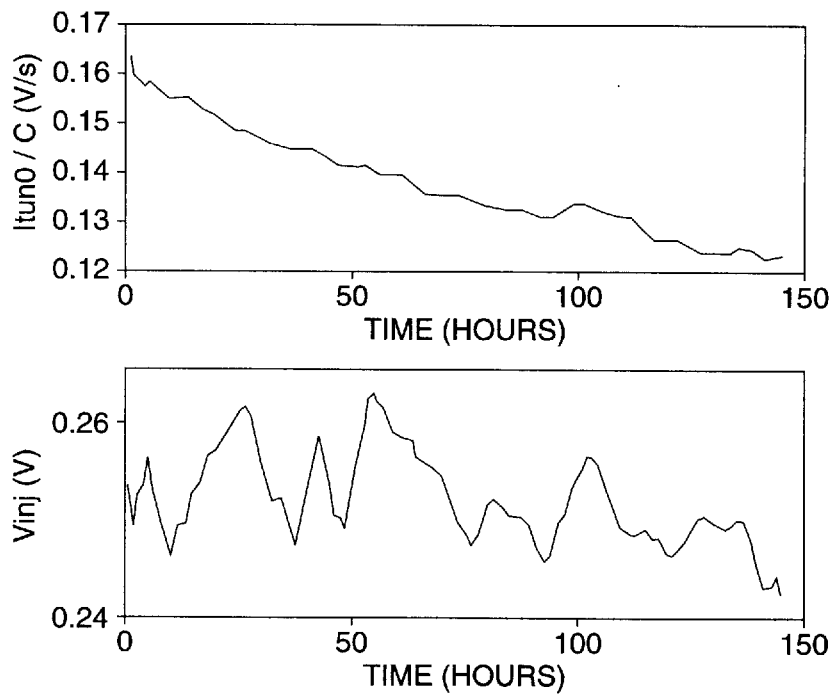
FIG. 8B shows the extracted device parameters of the AFGA as a function of time.

FIGS. 8A and 8B show the effect of operating an AFGA for a long time. In FIG. 8A the response to an upgoing and downgoing voltage step before and after 145 hours of operation is shown. The difference in the output voltage from its equilibrium DC level is plotted as a function of time; the equilibrium output voltage slightly increased from the 145 hours of operation. In FIG. 8B the extracted device parameters as a function of time are shown. Since $I_{tun0}/C_2$ changes more than $V_{inj}$, one can see that most of the long term change is due to the tunneling junction, which is probably due to oxide trapping.

High-Frequency AFGA Behavior

For sufficiently high frequencies, the AFGA is a low-pass filter. In this regime, the tunneling and injection currents are negligible; therefore EQ. 15 is approximated by:

$$(C_1 + C_2 + C_w)\frac{dV_{fg}}{dt} = C_1 \frac{dV_{in}}{dt} + C_2 \frac{dV_{out}}{dt} \quad \text{(EQ. 26)}$$

From EQ. 26, changes in $V_{out}$ are proportional to changes in $V_{fg}$ and $V_{in}$. At extremely high frequencies, the transistor channel currents are negligible compared to the capacitive currents. In this capacitive-feedthrough regime, the solutions to EQ. 16 and EQ. 26 are $$\frac{\Delta V_{fg}}{\Delta V_{in}} = \frac{C_1(C_2 + C_L)}{(C_1 + C_2 + C_w)(C_2 + C_L) - C_2^2} \quad \text{(EQ. 27)}$$

$$\frac{\Delta V_{out}}{\Delta V_{in}} = \frac{C_1 C_2}{(C_1 + C_2 + C_w)(C_2 + C_L) - C_2^2}$$

The effects of the capacitive feedthrough can be reduced by increasing either $C_L$ or $C_w$.

At frequencies between the low-frequency cutoff and the capacitive-feedthrough regime, the behavior of the AFGA results from the floating-gate voltage settling back to its equilibrium value. Therefore, combining EQ. 16 and EQ. 26 into a single equation for the floating-gate voltage:

$$((C_1 + C_2 + C_w)(C_2 + C_L) - C_2^2)\frac{dV_{fg}}{dt} = \quad \text{(EQ. 28)}$$

$$C_1(C_2 + C_L)\frac{dV_{in}}{dt} + C_2 I_\tau (e^{-\frac{\kappa \Delta V_{fg}}{U_T}} - 1)$$

This equation is similar to EQ. 21, which describes the output-voltage response in the low-frequency case. Substituting:

$$Y = e^{\frac{\kappa \Delta V_{fg}}{U_T}} \quad \text{(EQ. 29)}$$

into EQ. 28 results in the linear differential equation:

$$\tau_h \frac{dY}{dt} = \frac{\tau_{h2} \kappa}{U_T} \frac{dV_{in}}{dt} Y + 1 - Y \quad \text{(EQ. 30)}$$

$$\tau_{h2} = \frac{C_1(C_2 + C_L)U_T}{\kappa C_2 I_\tau} \quad \text{(EQ. 31)}$$

which is the time constant that marks the onset of capacitive feedthrough. Defining $\tau_h$:

$$\tau_h = \frac{((C_1 + C_2 + C_w)(C_2 + C_L) - C_2^2)U_T}{\kappa C_2 I_\tau} \quad \text{(EQ. 32)}$$

which represents the high-frequency cutoff.

As in the low-frequency case, the response to an input voltage step will be considered. To solve EQ. 30, first assume that the floating-gate voltage immediately after applying the step, $\Delta V_{fg}(0^+)$, is given by the magnitude of the input step attenuated by the capacitive divider ratio, EQ. 27. With this initial condition, the solution is:

$$\Delta V_{fg} = \frac{U_T}{\kappa} \ln(1 + (e^{\frac{\kappa \Delta V_{fg}(0^+)}{U_T}} - 1) e^{-\frac{1}{\tau_h}}) \quad \text{(EQ. 33)}$$

After the initial jump, given by EQ. 27, the output voltage is related to the floating-gate voltage by:

$$\Delta V_{out} = \frac{C_1 + C_2 + C_w}{C_2} \Delta V_{fg} \quad \text{(EQ. 34)}$$

Figure 9A:
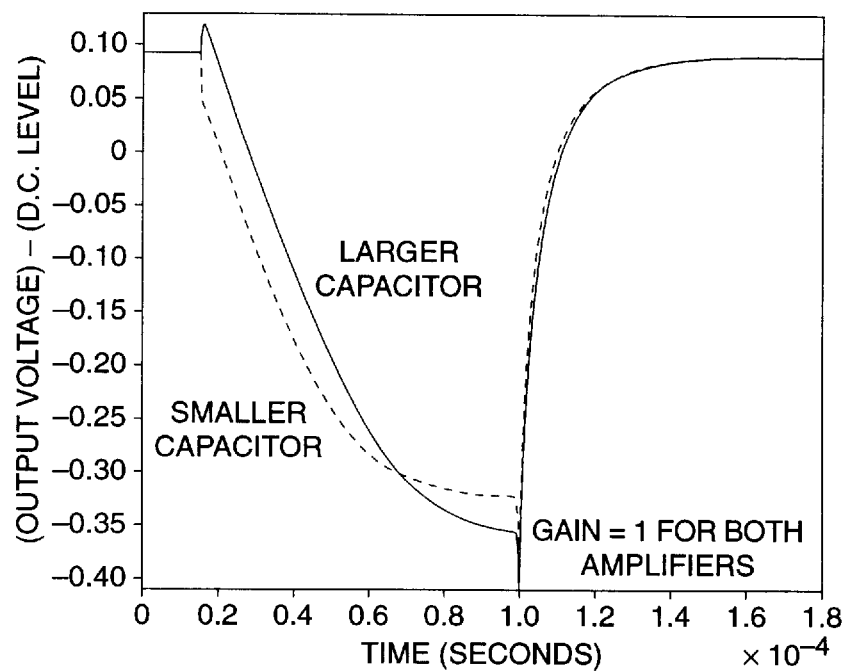
FIG. 9A shows voltage vs. time curves for two AFGAs with unity gain as shown, but with each having different values for $C_1$.
Figure 9B:
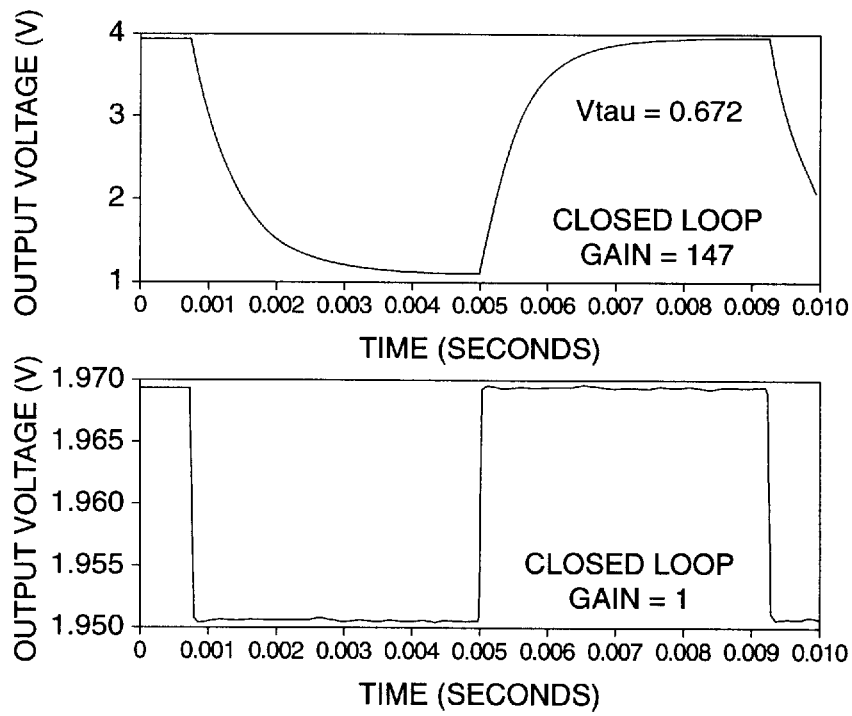
FIG. 9B shows voltage vs. time curves for two AFGAs with different gains.

FIGS. 9A–9B show the high-frequency AFGA behavior. In FIG. 9A, voltage vs. time curves for two AFGAs with unity gain are as shown, but with each having different values for $C_1$. The larger-capacitor circuit had $C_1=C_2=300$ fF, whereas the smaller-capacitor circuit had $C_1=C_2=50$ fF. For both AFGAs, $C_L$ was the same. The two AFGAs are operating the different subthreshold bias currents in order to achieve comparable settling times. As in the low-frequency case, the high-frequency response of the AFGA is asymetric: the downgoing step response approaches its steady state linearly with time, and the upgoing step response approaches its steady state logarithmically with time. The initial jump in the downgoing step is due to capacitive feedthrough. From these data, it is evident that decreasing $C_1$ and $C_2$ without changing $C_L$ will decrease the amount of capacitive feedthrough. FIG. 9B shows the voltage responses, to a small input step, for two AFGAs with respective gains of 1 and 146. The response from the unity-gain AFGA (at the bottom) shows a linear, first-order, low-pass filtered version of the input. These responses illustrate the gain-bandwidth tradeoff in the AFGA.

The linear 3 V output swing in the high-gain response of FIG. 9B raises the question: What determines the linear range of an AFGA? The criterion for linearity is that $\Delta V_{fg}$ be sufficiently small that the factor, $$\left( \exp\left( -\frac{\kappa \Delta V_{fg}}{U_T} \right) - 1 \right),$$

in EQ. 28 can be approximated by $$-\frac{\kappa \Delta V_{fg}}{U_T}.$$

This criterion implies that the floating-gate voltage must not move by more than $$\frac{U_T}{\kappa}$$

from its equilibrium value. The floating-gate voltage has its maximum swing in the capacitive-feedthrough regime; therefore, from EQ. 27 the input linear range, $V_{Li}$, is $$V_{Li} = \frac{U_T}{\kappa} \left( \frac{C_1 + C_2 + C_w}{C_1} \right) B \quad \text{(EQ. 35)}$$

where:

$$B = 1 - \frac{C_2^2}{(C_1 + C_2 + C_w)(C_L + C_2)} \quad \text{(EQ. 36)}$$

For amplifiers with gains greater than or equal to one, which requires that $C_1$ be greater than $C_2$, B is bounded between ½ and 1 for all $C_1$, $C_2$, $C_w$, and $C_L$. Further, if the AFGA is driving a $C_L$ that is at least as big as $C_1$, B is bounded between ¾ and 1. Consequently, B can be considered a correction term.

The output linear range, $V_{Lo}$, is expressed in terms of the input linear range, $V_{Li}$ by:

$$V_{Lo} = \frac{U_T}{\kappa} \left( \frac{C_1 + C_2 + C_w}{C_2} \right) B \quad \text{(EQ. 37)}$$

which is $V_{Li}$ times the amplifier gain, $C_1/C_2$. The output linear range scales with the amplifier gain. By increasing $C_w$, the change in the floating-gate voltage can be reduced, thereby increasing the amplifier's output linear range. The AFGA's gain from input to output in the passband is:

$$\frac{V_{out}}{V_{in}} = -\frac{C_1}{C_2} \; \frac{1}{1 + \frac{C_1 + C_2 + C_w}{C_2 A}} = \quad \text{(EQ. 38)}$$

$$-\frac{C_1}{C_2} \; \frac{1}{1 + \frac{\kappa V_{Lo}}{A U_T B}}$$

where A is the gain from floating gate to output. For a sufficiently large A, the AFGA's passband gain is independent of $C_w$.

Figure 10A:
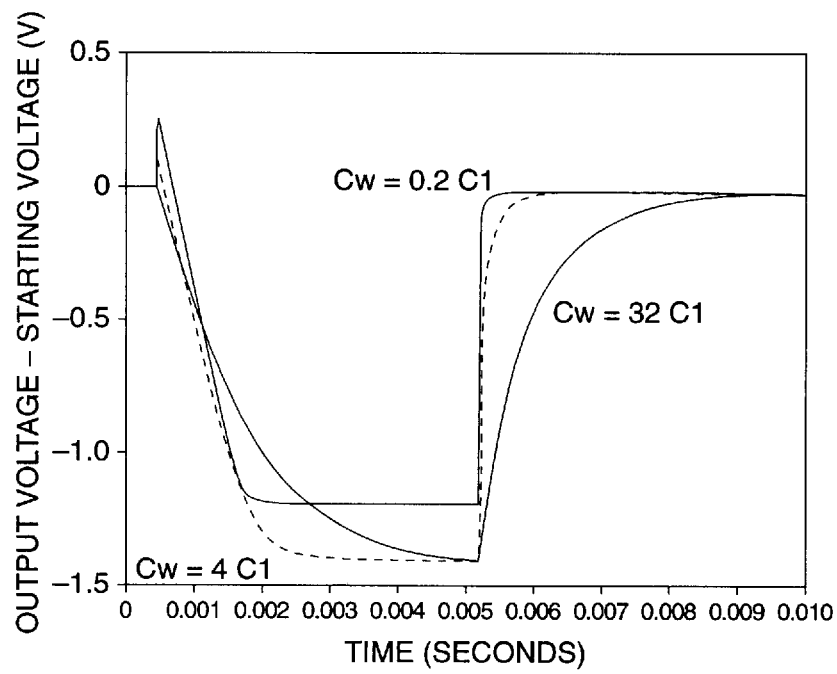
FIG. 10A shows the response of three AFGAs to the same square wave input. Here all three AFGAs were the same except for their values of $C_w$ and were biased by the same $V_r$.
Figure 10B:
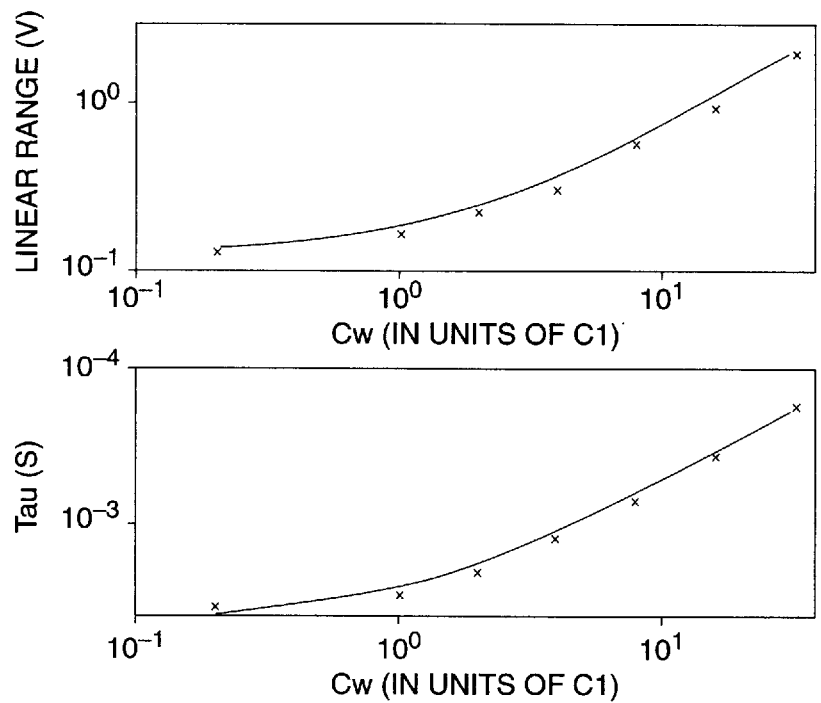
FIG. 10B shows the measured linear range and $\tau_h$ for several unity-gain AFGAs for different $C_w$ ratioed in units of $C_1$. Both curves in FIG. 10B are fitted with a linear equation.

FIGS. 10A–B show the linear range of the AFGA versus $C_w$. In FIG. 10A the response of three AFGAs to the same square wave input is shown. Here all three AFGAs were the same except for their values of $C_w$ and were biased by the same $V_t$. Increasing $C_w$ increases the linear range, decreases the amount of capacitive feedthrough, and decreases the low-pass cutoff frequency. FIG. 10B shows the measured linear range and $\tau_h$ for several unity-gain AFGAs for different $C_w$ ratioed in units of $C_1$. Both curves in FIG. 10B are fitted with a linear equation. For a unity gain AFGA, that is $C_1=C_2$, the expressions for $\tau_h$ and input linear range are:

$$\tau_h = \frac{U_T(C_1 + C_L)}{\kappa I_\tau} \left( 2 - \frac{C_1}{C_1 + C_L} + \frac{C_w}{C_1} \right) \quad \text{(EQ. 39)}$$

and:

$$V_{Li} = \frac{U_T}{\kappa} \left( 2 - \frac{C_1}{C_1 + C_L} + \frac{C_w}{C_1} \right) \quad \text{(EQ. 40)}$$

The data in FIGS. 10A–B was taken with AFGAs that had no explicitly drawn $C_L$; the variation between the data and the linear curve fit is most likely due to the different parasitic load capacitances. Both from experimental data and the direct analytic solution of EQ. 30, second harmonic distortion dominates for the AFGAs; for a sine-wave input with amplitude of $V_{Li}$, the peak second harmonic distortion is 0.05 percent of, or 26 dB below, the fundamental frequency response. The second harmonic distortion is maximum for frequencies just below $$\frac{1}{2\pi\tau_h};$$

for amplitudes at or below $V_L$, the second harmonic distortion is proportional to the square of the fundamental amplitude.

Frequency Response of the AFGA

In order to derive the AFGA frequency response, one begins with the small-signal form of EQ. 15 and EQ. 16:

$$(C_1 + C_2 + C_w)\frac{dV_{fg}}{dt} = C_1\frac{dV_{in}}{dt} + C_2\frac{dV_{out}}{dt} + \frac{I_{tun0}}{V_{inj}}\Delta V_{out}, \quad \text{(EQ. 41)}$$

$$(C_2 + C_L)\frac{dV_{out}}{dt} = C_2\frac{dV_{fg}}{dt} - \frac{\kappa I_\tau}{U_T}\Delta V_{fg}$$

that is, one assumes that the input signal is sufficiently small that one needs to keep only the linear terms when expanding the exponentials. A small-signal input changes $V_{out}$ by less than $V_{inj}$, due to the injection nonlinearity in the low-frequency regime, and $V_{fg}$ by less than $$\frac{U_T}{\kappa},$$

due to the transistor nonlinearity in the high-frequency regime.

Figure 11A:
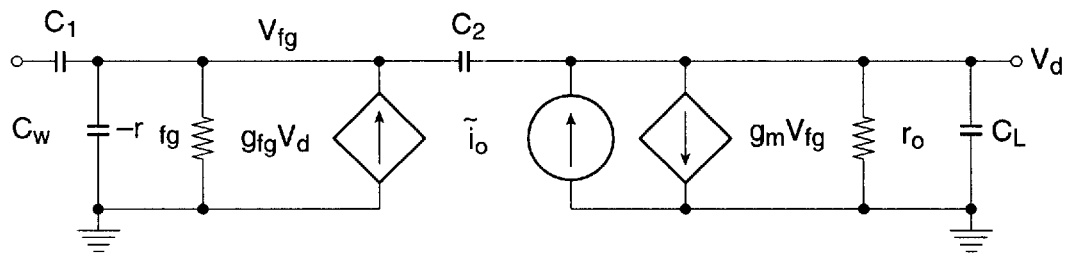
FIGS. 11A, B and C depict an AFGA represented as a small-signal circuit.
Figure 11B:
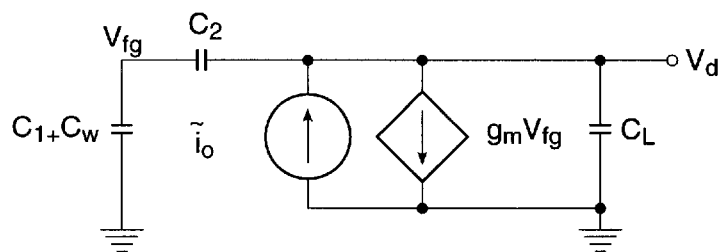
FIG. 11B shows the small-signal model of the effect of the noise source in the channel on the output voltage. The effect of the gate current and the Early voltage effect has been neglected here.
Figure 11C:
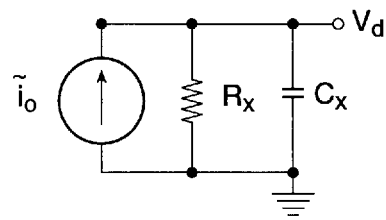
FIG. 11C shows a simplified small-signal model of the effect of noise.

FIGS. 11A–C depict an AFGA represented as a small-signal circuit. FIG. 11A shows the small-signal AFGA model using the small-signal pFET model. FIG. 11B shows the small-signal model of the effect of the noise source in the channel on the output voltage. The effect of the gate current and the Early voltage effect has been neglected here. FIG. 11C shows a simplified small-signal model of the effect of noise. For clarity, we define $$R_x = \frac{C_1 + C_2 + C_w}{g_m C_2}, \text{ and } C_x = C_L + C_2\left(1 - \frac{C_2}{C_1 + C_2 + C_w}\right).$$

EQ. 41 can also be obtained by analyzing the small-signal circuit in FIG. 11A. The response in the low-frequency and high-frequency regimes, which typically do not interact will be discussed in turn. Finally, the general solution will be presented.

For low-frequency inputs, one can approximate EQ. 41 as:

$$\tau_l \frac{C_1}{C_2}\frac{dV_{in}}{dt} + \tau_l \frac{dV_{out}}{dt} = -\Delta V_{out} \quad \text{(EQ. 42)}$$

for which the resulting frequency response is:

$$\frac{V_{out}(s)}{V_{in}(s)} = -\frac{C_1}{C_2}\frac{s\tau_l}{1 + s\tau_l} \quad \text{(EQ. 43)}$$

For high-frequency inputs, one can simplify EQ. 41 by assuming input frequencies much larger than $$\frac{1}{2\pi\tau_l},$$

which are written:

$$\frac{V_{out}}{V_{in}} = -\frac{C_1}{C_2}\frac{1 - \tau_{h2}s}{1 + \tau_h s} \quad \text{(EQ. 44)}$$

Figure 12:
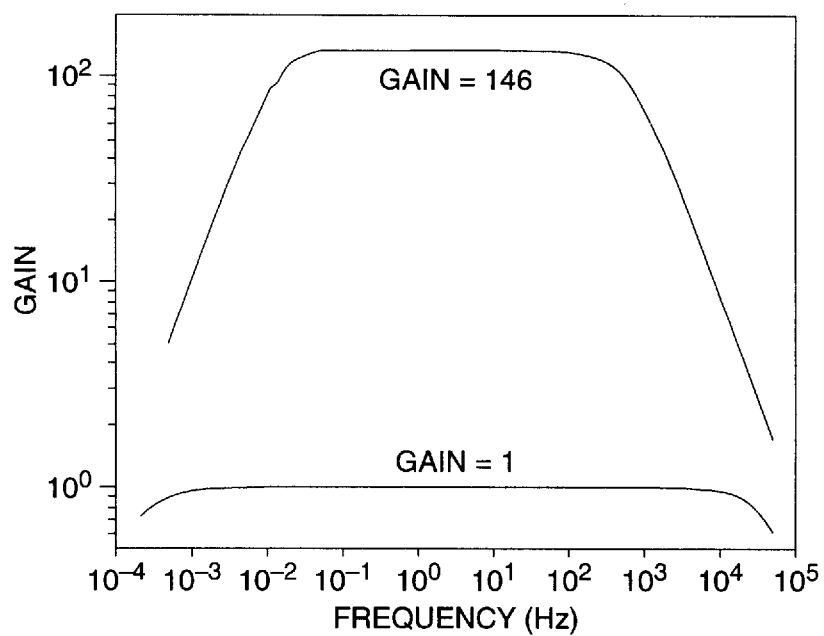
FIG. 12 shows the frequency response for two AFGAs with different gains. For both the high-and low-gain AFGA, $C_1+C_2$ is approximately constant. For the high-gain AFGA, $\tau_l$ is 8 sec, and $\tau_h$ is 265 $\mu$sec; for the low-gain AFGA, $\tau_l$ is 530 sec and $\tau_h$ is 4 $\mu$sec. The ratio of $\tau_h$ and $\tau_l$ between the two AFGAs are equal to half of the ratio of the gains, which is consistent with a constant $C_1+C_2$.

This transfer function includes the effects of parasitic and load capacitances. The response in EQ. 44 is the transfer function of a first-order system; because capacitive feedback is used, the AFGA is stable for any value of closed loop gain. As seen in FIG. 12, $\tau_h$ is 265 $\mu$sec for the high-gain AFGA, and $\tau_h$ is 4 $\mu$sec for the low-gain AFGA.

The response for all frequencies is obtained by taking the Laplace transform of EQ. 41, which is $$s(C_1 + C_2 + C_w)V_{fg} = sC_1V_{in} + \left(sC_2 + \frac{I_{tun0}}{V_{inj}}\right)V_{out}, \quad \text{(EQ. 45)}$$

$$s(C_2 + C_L)V_{out}(s) = \left(sC_2 + \frac{\kappa I_\tau}{U_T}\right)V_{fg}$$

EQ. 45 is solved to obtain:

$$\frac{V_{out}(s)}{V_{in}(s)} = -\frac{C_1}{C_2}\frac{1 - \tau_{h2}s}{1 + \tau_h s + \frac{1}{\tau_l s}} \quad \text{(EQ. 46)}$$

where $\tau_l$, $\tau_h$, $\tau_{h2}$ were defined previously.

FIG. 12 shows the frequency response for two AFGAs with different gains. The high-gain AFGA has a gain of 146, and the low-gain AFGA has unity gain. For both the high and low-gain AFGA, $C_1+C_2$ is approximately constant. For the high-gain AFGA, $\tau_l$ is 8 sec, and $\tau_h$ is 265 $\mu$sec; for the low-gain AFGA, $\tau_l$ is 530 sec and $\tau_h$ is 4 $\mu$sec. The ratio of $\tau_h$ and $\tau_l$ between the two AFGAs are equal to half of the ratio of the gains, which is consistent with a constant $C_1+C_2$.

Figure 13A:
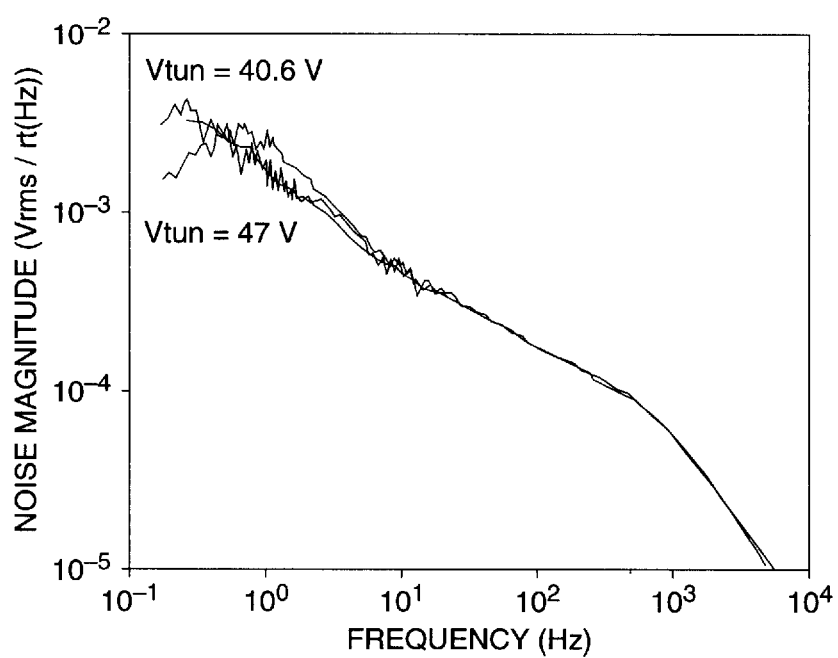
FIGS. 13A–B depict a noise spectrum of an AFGA for a constant input.

When considering the frequency response of the AFGA, it is natural to consider the output-voltage spectrum for no input-that is, the output voltage noise from the amplifier. FIGS. 13A–3B show AFGA output-voltage spectrums for a fixed, voltage-source input. For low frequencies, $1/f$ noise is dominant, and for high frequencies, thermal noise dominates. The AFGA filters the $1/f$ noise below the low-frequency cutoff.

Figure 13B:
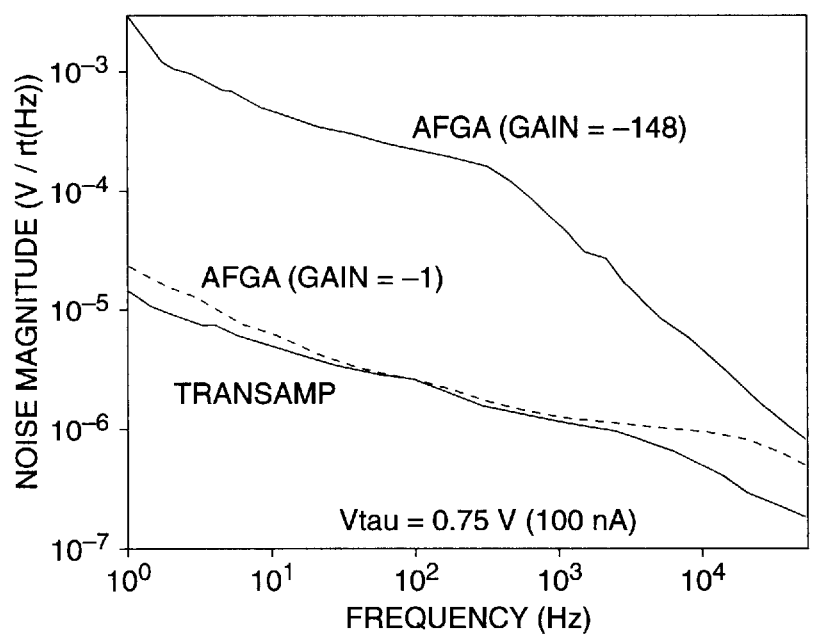

FIGS. 13A–B depict a noise spectrum of an AFGA for a constant input. FIG. 13A shows the output noise spectrum of an AFGA with a gain of 146 for two different tunneling voltages ($V_{tun}$). The high-frequency cutoff eliminates $1/f$ noise at frequencies below $1/\tau_l$. The spectrum was taken for a bias current of 80 nA, which corresponds to $V_t$ of 0.73 V. FIG. 13B shows a comparison of a high-gain AFGA with a unity gain AFGA and a generic follower-connected differential amplifier. All three amplifiers had the same $V_t$ voltage, and correspondingly had the same bias current. The sum of $C_1$ and $C_2$ is the same for both AFGAs. FIG. 13A shows that we can reduce the $1/f$ noise by increasing $V_{tun}$, and thereby decreasing $\tau_l$. FIG. 13B shows a comparison between a high-gain AFGA, a unity gain AFGA, and a follower-connected transconductance amplifier. The transconductance amplifier is the wide-range amplifier as described in C. Mead, Analog VLSI and Neural Systems, Addison-Wesley, 1989; it has larger transistors than do the AFGAs, resulting in the lower $1/f$ noise in FIG. 13B. The AFGAs used a constant tunneling current; therefore, we conclude that the tunneling and injection processes do not significantly contribute to the noise levels.

It is of interest to investigate how changing the AFGA design will change the amount of output noise. Following Rahul Sarpeshkar, Tobias Delbruck, and Carver A. Mead, "White Noise in MOS Transistors and Resistors," *IEEE Circuits and Devices*, Nov. 1993, pp. 23–29., one can model the thermal noise component, $i_o$ of a subthreshold MOSFET's channel current by:

$$\frac{\hat{i_o}^2}{\Delta f} = \frac{2}{\kappa}qU_T g_m r \quad \text{(EQ. 47)}$$

Because the AFGA's output comprises both an nFET and a pFET, the total thermal-noise current derives from two parallel noise sources. To find the output-referred voltage noise, the simplified small-signal circuit of FIG. 11B can be used. The small-signal circuit of FIG. 11B can be further simplified to that shown in FIG. 11C, by noting that one can relate $V_{fg}$ to $V_{out}$ by a capacitive divider. From this simpler circuit, we express the signal power of the output-referred voltage noise; $\hat{V}^2_{out}$ can be expressed as:

$$\hat{V}^2_{out} = \left( \frac{C_1 + C_2 + C_w}{C_2 g_m} \right)^2 \frac{\hat{i}_o^2}{1 + (\omega \tau_h)^2} \quad \text{(EQ. 48)}$$

where $\tau_h$ was defined above. From this expression, the total-output-noise power is:

$$\hat{V}^2_{out} = \frac{4}{\kappa} q U_T g_m \left( \frac{C_1 + C_2 + C_w}{C_2 g_m} \right)^2 \int_0^\infty \frac{1}{1 + (\omega \tau_h)^2} df$$

which, using EQ. 32 evaluates to:

$$\hat{V}^2_{out} = \frac{q U_T}{\kappa B} \frac{C_1 + C_2 + C_w}{C_2 (C_L + C_2)} \quad \text{(EQ. 49)}$$

with the correction term, B, as defined in EQ. 36. The total-output-noise power is roughly proportional to $C_w$ and inversely proportional to $C_L$. R. Sarpeshkar, R. F. Lyon, and C. Mead, "A low-power wide-liniear-range transconductance amplifier", *Analog Integrated Circuits and Signal Processing*, in Press. See also, U.S. Pat. No. 5,463,348 entitled "CMOS Low-Power, Wide-Liniear-Range, Well-Input Differential and Transconductance Amplifiers".

To calculate the dynamic range of an AFGA one may define the dynamic range (DR) in terms of signal power as the ratio of the maximum possible output swing corresponding to the input linear range and an input that has an equivalent swing to the total-output-noise power. With this definition, which is equivalent to EQ. 12, we can express the dynamic range for the AFGA as:

$$DR = \frac{V_{Lo}^2}{2\hat{V}^2_{out}} = \frac{\kappa}{2q} V_{Lo}(C_L + C_2) B^2 \quad \text{(EQ. 50)}$$

which is a similar form for dynamic range for the wide-linear-input-range amplifier discussed in R. Sarpeshkar, R. F. Lyon, and C. Mead, "A low-power wide-linear-range transconductance amplifier", *Analog Integrated Circuits and Signal Processing*, in Press. See also, U.S. Pat. No. 5,463, 348 entitled "CMOS Low-Power, Wide-Linear-Range, Well-Input Differential and Transconductance Amplifiers". Like the wide-linear-input-range amplifier, this amplifier increases dynamic range by amplifying the signal more than the total amplifier noise. The cost for this performance enhancement is a proportional increase in the power dissipation. Another direct result of this expression is that the dynamic range varies inversely with $C_2$; therefore, a high-gain amplifier will have a larger dynamic range than the low-gain amplifier for the same $C_1$, $C_w$, and $C_L$.

Steady-State Output-Voltage Dependence on the Output Signal

In this section, the dependence of the steady-state output voltage on the amplitude of the input signal is discussed. Consider the range of frequencies in which the input voltage changes at a rate that is much slower than the circuit's integrating behavior, but is much faster than the adaptation due to the tunneling and injection currents; that is, the input is entirely in the AFGA's passband.

Figure 14:
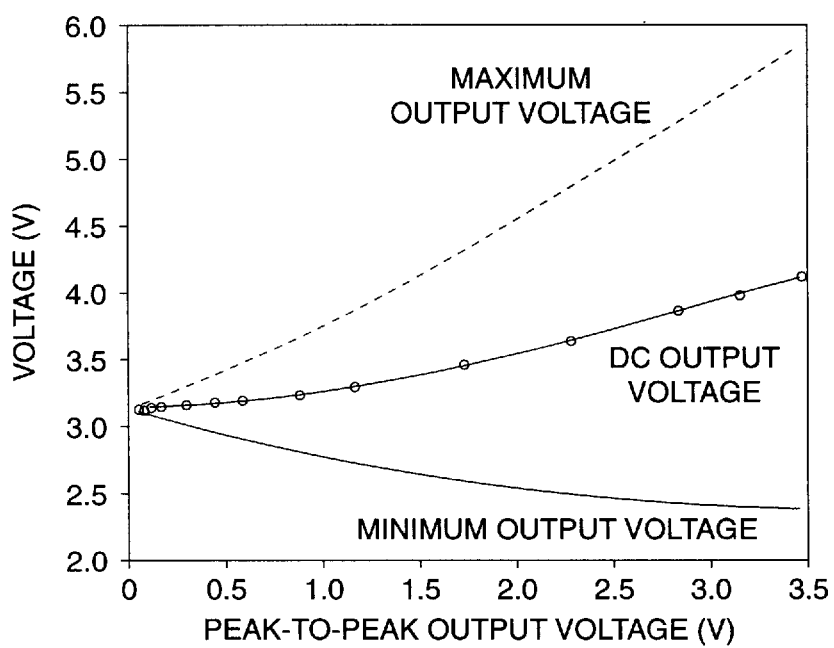
FIG. 14 shows, for an AFGA with a gain of 146, the minimum and maximum output voltages verses peak-to-peak output-voltage amplitude. The frequency of the input sine wave was 100 Hz.

FIG. 14 shows measurements of the minimum and maximum output voltages versus output amplitude. For small input amplitudes, the minimum and maximum output symmetrically diverge from the steady-state voltage, but for large input amplitudes, most of the change in the output voltage is due to the maximum of the output voltage increasing. In general, the steady-state output voltage converges to within about $V_{inj}$ of the minimum of the signal.

To analyze this effect, we decompose the output voltage into components that change at fast and slow rates. We assume that we can express the output voltage as a sum of fast and slow variables; that is:

$$\Delta V_{out} = \Delta \hat{V}_{out} + \Delta \bar{V}_{out} \quad \text{(EQ. 51)}$$

where $\Delta \hat{V}_{out}$ represents the fast-timescale behavior, and is the amplified version of $$\Delta V_{in} \left( \Delta \hat{V}_{out} \approx -\frac{C_1}{C_2} \Delta V_{in} \right),$$

and $\Delta \bar{V}_{out}$ represents the slow-timescale behavior. With this formulation, EQ. 51 can be integrated over a large number of periods of the fast timescale, but can still make only a small change in the slow-timescale output voltage. E[.] shall mean the average of a time-varying signal, x (t), over a time interval, T, that is sufficiently shorter than the slow timescale, but is much longer than the shortest period of the fast variables:

$$E[x(t)] = \frac{1}{T} \int_0^T x(t) dt \quad \text{(EQ. 52)}$$

By this definition, $$E\left[ \frac{dV_{in}}{dt} \right] \to 0, E\left[ \frac{dV_{out}}{dt} \right] \to \frac{d\bar{V}_{out}}{dt} \quad \text{(EQ. 53)}$$

The resulting equation in $\Delta \bar{V}_{out}$ is $$C_2 \frac{d\bar{V}_{out}}{dt} = I_{tun0}(E[e^{-\frac{\Delta V_{out}}{V_{inj}}}] - 1) \quad \text{(EQ. 54)}$$

Expressing $$E[e^{-\frac{\Delta V_{out}}{V_{inj}}}]$$

in terms of the fast and slow variables:

$$E[e^{-\frac{\Delta V_{out}}{V_{inj}}}] = e^{-\frac{\Delta \bar{V}_{out}}{V_{inj}}} Q \quad \text{(EQ. 55)}$$

$$Q = E[e^{-\frac{\Delta \hat{V}_{out}}{V_{inj}}}] \quad \text{(EQ. 56)}$$

Rewriting EQ. 54 as:

$$C_2 \frac{d\bar{V}_{out}}{dt} = I_{tun0}(Q e^{-\frac{\Delta \bar{V}_{out}}{V_{inj}}} - 1) \quad \text{(EQ. 57)}$$

From the analysis above, the solution to EQ. 54 is:

$$\Delta \bar{V}_{out} = V_{inj} \ln(Q + (e^{-\frac{\Delta \bar{V}_{out}}{V_{inj}}} - Q) e^{-\frac{t}{\tau}}) \quad \text{(EQ. 58)}$$

where the steady state solution for $\Delta \bar{V}_{out}$ is:

$$\Delta \bar{V}_{out} = V_{inj} \ln(E[e^{-\frac{\Delta \hat{V}_{out}}{V_{inj}}}] - 1) \quad \text{(EQ. 59)}$$

The amplifier always adapts such that the minimum of the output signal always returns to the equilibrium output voltage.

Now, consider the behavior of the output voltage as a function of different amplitude sine waves applied to the input. The version of the input signal after it is amplified by the AFGA is defined as $\Delta \hat{V}_{out}=A \sin(\bullet t)$; for this output signal, the steady state voltage is:

$$\Delta \overline{V}_{out} \approx V_{inj} \ln\left(\frac{2}{3} + \frac{1}{3}\cosh\left(\frac{A}{2V_{inj}}\right)\right) \quad \text{(EQ. 60)}$$

FIG. 14 shows, for an AFGA with a gain of 146, the measured minimum and maximum output voltages verses peak-to-peak output-voltage amplitude. The frequency of the input sine wave was 100 Hz. For small input amplitudes, the minimum and maximum output voltages symmetrically diverge from the steady state voltage, but for large input amplitudes, most of the output voltage change follows the maximum output voltage. The DC voltage was fit to the function $0.25 \ln (0.667+0.333 \exp(V_{dc}/0.62))$, which is nearly equal to EQ. 60.

Other AFGA Effects

A. Modeling the Above-Threshold AFGA

The operation of an autozeroing floating-gate amplifier operating with above threshold bias currents does not change from the subthreshold case in three important respects. First, those effects that depend on electron tunneling remain the same, because tunneling is not a function of the MOSFET channel current. Second, the injection current is still the exponential of roughly the same function of the drain voltage. Third, the low frequency dynamics should remain unchanged for a constant $C_2$, because the channel current is still nearly fixed by feedback.

The pFET hot-electron injection model changes for above-threshold bias currents in two ways. First, the source current is not an exponential function of the gate voltage, but varies quadratically with the gate voltage. Second, although operating the AFGA above threshold has little effect on the hot-electron-injection efficiency, the injection current/source current efficiency will decrease above threshold because the impact-ionization efficiency will decrease, because the channel potential decreases near the drain edge with decreasing gate voltage. The above-threshold injection-current model from EQ. 9 can be modified to be:

$$I_{inj} = I_{inj0}\left(\frac{V_{dd}-V_{fg}-\Delta V_{fg}+V_T}{V_{dd}-V_{fg}+V_T}\right)^2 e^{-\frac{\Delta V_d - \kappa \Delta V_g}{V_{inj}}} \quad \text{(EQ. 61)}$$

$$\approx I_{inj0}\left(1 - \frac{2\Delta V_{fg}}{V_{dd}-V_{fg}+V_T}\right)e^{-\frac{\Delta V_d - \kappa \Delta V_g}{V_{inj}}}$$

$$\approx I_{inj0}\exp\left(-\frac{2\Delta V_{fg}}{V_{dd}-V_{fg}+V_T}\right)e^{-\frac{\Delta V_d}{V_{inj}}}.$$

This model modifies the DC output voltage, as mentioned above, to be:

$$\Delta V_{out} = \quad \text{(EQ. 62)}$$

$$-\frac{V_{inj}}{V_x}\Delta V_{tun} + V_{inj}\frac{\kappa_n}{\kappa}\left(\frac{2}{V_{dd}-V_{fg}+V_T} - \frac{1}{V_x}\right)\Delta V_\tau$$

Recall from FIG. 6, that the equilibrium output voltage versus the bias current began to saturate for above-threshold bias currents.

Now consider how the high frequency behavior changes for above-threshold bias currents. For above-threshold currents, EQ. 28 is modified to:

$$\tau_h \frac{dV_{fg}}{dt} = \tau_{h2}\frac{dV_{in}}{dt} - \Delta V_{fg}\left(1 - \frac{\kappa \Delta V_{fg}}{V_{dd}-\kappa(V_{fg0}+V_{T0})}\right) \quad \text{(EQ. 63)}$$

The definitions of $\tau_h$ and $\tau_{h2}$ are similar to their subthreshold definitions, $$\tau_{h2} = \frac{C_1(C_2+C_L)(V_{dd}-\kappa(V_{fg0}+V_{T0}))}{\kappa C_2 I_\tau} \quad \text{(EQ. 64)}$$

and $$\tau_h = ((C_1+C_2+C_w)(C_2+C_L) - C_2^2)\frac{V_{dd}-\kappa(V_{fg0}+V_{T0})}{\kappa C_2 I_\tau} \quad \text{(EQ. 65)}$$

The higher bias current results in a higher cutoff frequency, but also requires an increase in power dissipation. The linear input range of the amplifier is larger than it is for subthreshold bias currents. The linear input voltage range is $$\frac{C_1+C_2+C_w}{\kappa C_1}(V_{dd}-\kappa(V_{fg0}+V_{T0})).$$

The large-signal dynamics change for above threshold biases, when the input voltage exceeds its linear range. The floating-gate-to-drain capacitance is a function of the drain voltage, which adds additional dynamics to the large signal response.

Figure 15:
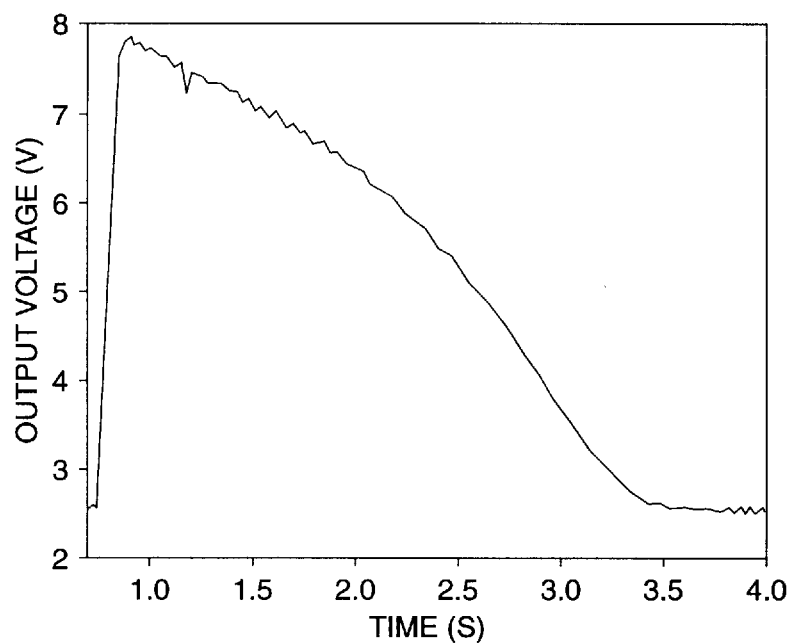
FIG. 15 shows the response of an above threshold autozero amplifier to a slow downgoing step.

FIG. 15 shows the response of an above threshold autozero amplifier to a slow downgoing step. The capacitance of the floating-gate changes with the output voltage due to the change in the capacitance between the output and the floating gate.

B. Continuous Operation of the Tunneling Current

It is of interest to understand what happens when a continuously operating tunneling current is not present in the AFGA. The constant tunneling bias current naturally eliminates the effect of DC biasing points; without this current, the circuit is no longer an autozeroing amplifier. Without the constant tunneling current, circuitry must be added to remove the effect of the DC input voltage. Furthermore, additional $1/f$ noise is generated in this floating-gate amplifier, since the high-pass behavior, due to the floating-gate adaptation, filters out a substantial amount of $1/f$ noise.

Assume that one wants to autozero the floating-gate amplifier only to set a particular operating point. Then, after this calibration phase, one needs to lower the tunneling voltage and power supply to turn off the electron-tunneling and hot-electron-injection processes to eliminate the oxide currents. Unfortunately, the capacitive coupling of the tunneling junction and capacitances not referenced to $V_{dd}$ to the floating gate will make potentially large changes in the output voltage. This effect can be minimized by using small tunneling junctions and by ensuring that all the capacitances (including all parasitics) coupling into the floating gate are referenced to $V_{dd}$.

In addition to the capacitive coupling, the charge on the floating gate will change due to electron traps in the oxides. When tunneling or injecting electrons into $SiO_2$, a portion of these electrons will become trapped in the oxide, E. H. Nicollian and J. R. Brews, MOS Physics and Technology, Wiley Interscience, 1982. In addition, as more current passes through these oxides, more electron traps are created, C. Hu, S. Tam, F. Hsu, P. Ko, T. Chan, and K Terrill, "HotElectron-Induced MOSFET Degradation-Model, Monitor and Improvement", *IEEE Transactions on Electron Devices*, Vol. ED-32, No. 2, Feb. 1985, pp. 375–385. After the oxide currents stop, some of these trapped electrons will become free thermally, and will find their way to the floating gate.

This effect will result in a large drift in the output voltage over time for the same input bias voltage.

Figure 16:
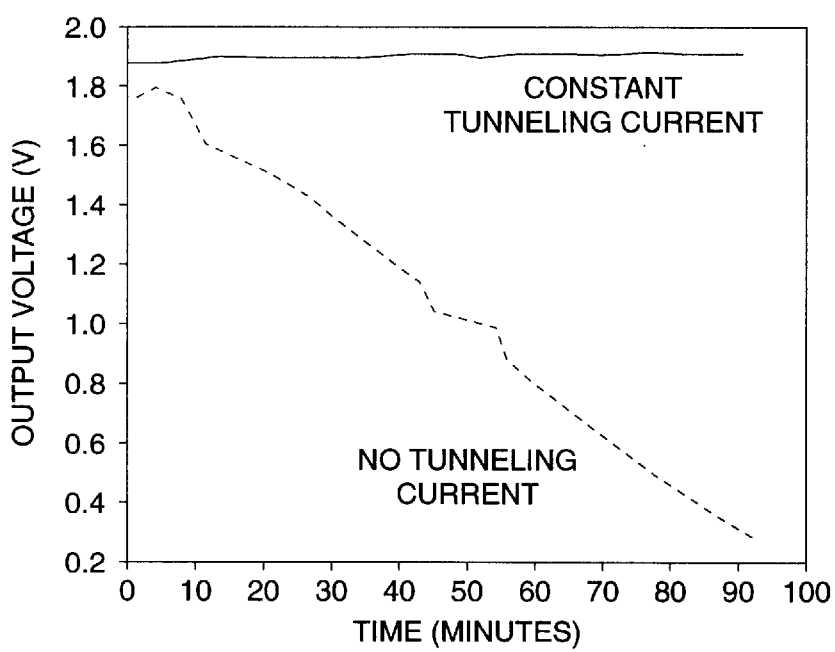
FIG. 16 shows the change in the AFGA output voltage with and without a continuous tunneling current. An AFGA with a gain of 146 was used for each case. The case for no tunneling current also required dropping the power supply; $V_{dd}$ was set at 5 V. The trace with no tunneling current was taken five minutes after the tunneling line was dropped.

FIG. 16 shows the change in the AFGA output voltage with and without a continuous tunneling current. An AFGA with a gain of 146 was used for each case. The case for no tunneling current also required dropping the power supply; $V_{dd}$ was set at 5 V. The trace with no tunneling current was taken five minutes after the tunneling line was dropped. The change in the output voltage over time for a high-gain AFGA with and without a constant tunneling current is shown in FIG. 16. The detrapping effect in this high-gain AFGA shows no sign of stopping until the output runs into ground; in a lower-gain circuit, the detrapping may eventually settle out within the power supply.

C. Restoration to Equilibrium of an Output Voltage when Starting at the Voltage Rails What happens when the output voltage starts at one of the supply rails? The output voltage starts at $V_{dd}$ when the floating-gate voltage is too low. In this regime, there is no injection current, and the tunneling current removes electrons from the floating gate, raising the floating-gate voltage. Eventually, the floating-gate voltage increases to its steady-state level, and the output voltage decreases from $V_{dd}$. If the output voltage starts near ground, then the pFET cannot get sufficient channel current to develop enough injection to balance the tunneling current. The current must be balanced by changes in the floating-gate voltage: in this case, the floating-gate voltage will increase, since the tunneling current is stronger than the pFET injection current. Unfortunately, the resulting pFET channel current will decrease even further, and that will decrease the injection current, leading to a runaway condition. The steady-state output voltage may not return to the original equilibrium level. Typically, this condition poses no problem even for reasonably large changes in the input voltage; however, this effect is seen when large changes in $V_\tau$ are made. Decreasing $V_{tun}$, decreasing the input voltage, increasing $V_\tau$, or increasing $V_{dd}$ might allow the AFGA to recover from this condition.

An Implementation of An AFGA in Silicon

Figure 17A:
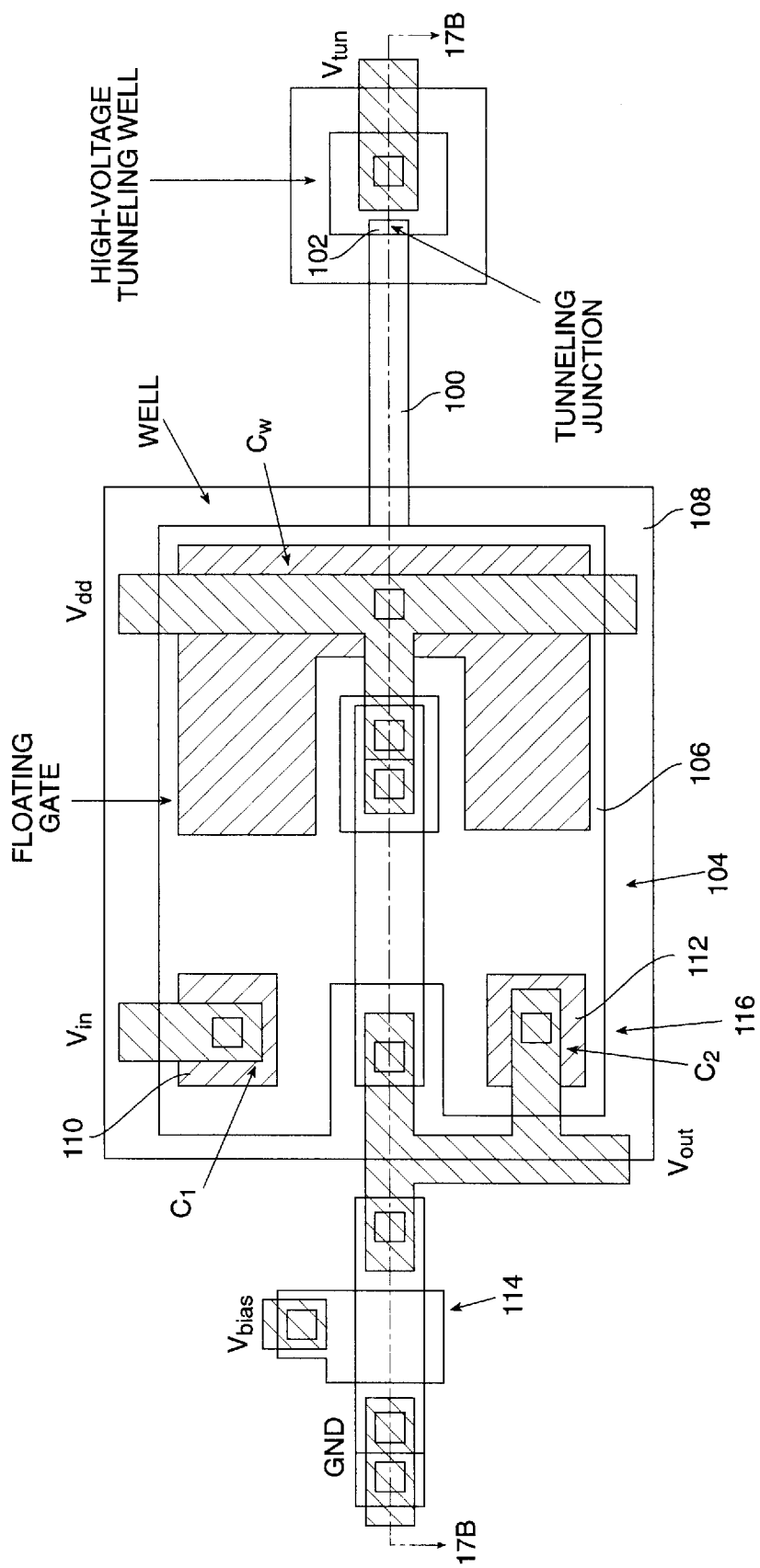
FIGS. 17A–B depict an implementation of an AFGA according to a presently preferred embodiment of the present invention in a 2-micron n-well CMOS process.
Figure 17B:
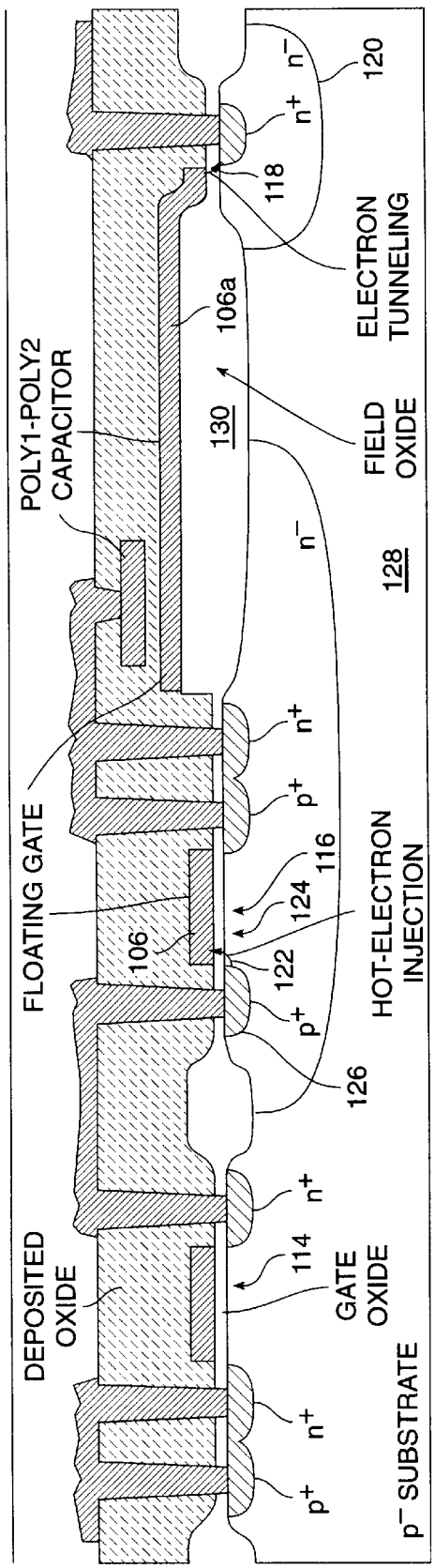

An AFGA has been constructed in a standard 2-micron, double-poly, n-well, CMOS process. The device is shown in FIGS. 17A and 17B. Typical dopant levels used in this implementation are as follows: for p$^+$ and n$^+$ active regions, $10^{19}$ to $10^{20}$ cm$^{-3}$; for n$^-$ well regions, $10^{16}$ cm$^{-3}$; for p$^-$ substrate, $5\times10^{15}$ cm$^{-3}$. The field oxide is usually between 0.5 and 1.0 microns thick and the gate oxide is usually 400 Å thick.

FIG. 17A shows a top plan view of the AFGA. With the exception of the minimum-width finger 100 that extends out to the tunneling junction 102 from the floating gate pFET 104, the polysilicon floating gate 106 is preferably completely surrounded by an n$^-$ well 108 in order to maximize power supply rejection. The high-voltage (typically +35 to +40 volts DC) tunneling well is typically placed at least 15 microns from the nearest well in order to ensure that the depletion regions surrounding the wells do not punch through. The ratio of the area of input capacitor C$_1$ (110), to the area of the feedback capacitor, C$_2$ (112), determines the AFGA's closed loop passband AC gain, which is ideally equal to $-C_1/C_2$ (i.e. inverting). The nFET 114 and pFET 116 transistors shown are both 6 microns wide and 9 microns long; however, those dimensions are not critical. The length of each transistor determines its Early voltage. These parameters, in turn, determine the open-loop gain of the amplifier; the greater the open-loop gain of the amplifier, the more accurate the closed-loop passband gain. The width of the pFET determines the size of the parasitic floating-gate-to-drain overlap capacitance (about 0.1 fF/μm of floating-gate-to-drain overlap). The size of this parasitic capacitance compared to the size of the feedback capacitor, C$_2$ (112), (about 0.5 fF/μm$^2$ of poly 1-poly 2 overlap) also determines the accuracy of the AFGA's closed-loop passband gain. The size of the capacitance from $V_{dd}$ (power supply at approximately +12 volts (a range of about +7 VDC to about +15 VDC is presently preferred)) to the floating-gate, C$_w$, determines the magnitude of the AFGA's linear range.

At FIG. 17B a cross-sectional side view taken along line 17B—17B of FIG. 17A is shown. The horizontal dimension is roughly to scale and aligned with the layout view of FIG. 17A, however, the vertical scale has been greatly exaggerated for clarity. All SiO$_2$ electron transport is preferably done through high quality, thermally grown gate oxide rather than through poorly controlled, deposited interpoly oxide for improved and consistent performance. The majority of electron tunneling occurs at 118 along the edge of the overlap between the floating gate and the n$^+$ contact in the high-voltage well 120 as shown. The majority of hot-electron injection occurs in a narrow region 122 in the channel 124 of the pFET 116 relatively close to the drain region 126 as shown. The portion of the floating gate 106a which extends out over the substrate 128 to tunneling junction 118 in well 120 should be over field oxide 130 in order to minimize the floating-gate-to-substrate capacitance and aid in rejecting power supply noise.

Alternative Embodiments Employing the AFGA

The autozeroing technique used in the autozeroing floating-gate amplifier (AFGA) can be applied to a wide variety of floating-gate MOS circuits (See, for example, B. A. Minch, C. Diorio, P. Hasler, and C. A. Mead, "Translinear Circuits Using Subthreshold Floating-Gate MOS Transistors," *Analog Integrated Circuits and Signal Processing*, vol. 9, no. 2, 1996, pp. 167–179.) to continuously restore some desired baseline operation on a slow timescale-on the order of seconds or longer. FIGS. 18–25 illustrate some of the floating-gate MOS circuits that we have conceived of that use this same technique.

Figure 18A:
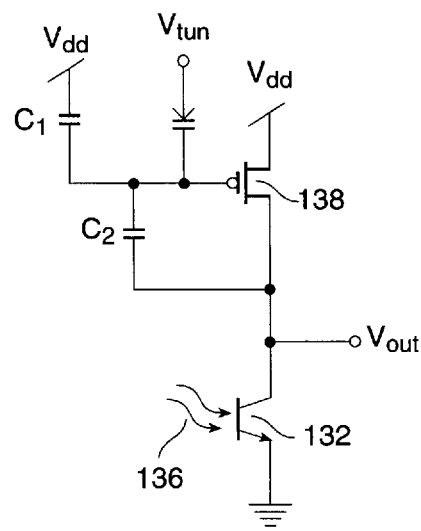
FIGS. 18A–B show circuits for two autozeroing photoreceptors.
Figure 18B:
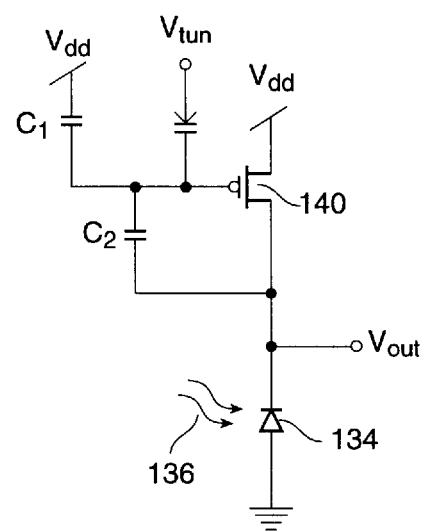

FIGS. 18A–B show circuits for two autozeroing photoreceptors: FIG. 18A utilizes a phototransistor 132 and FIG. 18B utilizes a photodiode 134. In each case, an incoming light signal 136 is transduced into a proportional photocurrent. This current is then transformed into an output voltage, $V_{out}$, by an autozeroing pFET 138, 140, respectively. These photoreceptors have a logarithmic response to transient changes in intensity; the slope of this response is governed by the ratio $C_1/C_2$. Slow variations in the background light intensity are adapted out by the autozeroing behavior.

Figure 19A:
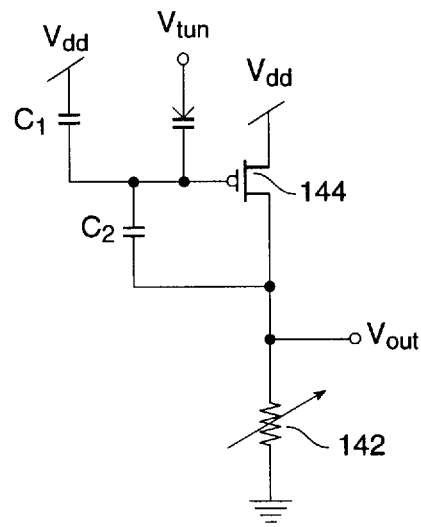
FIGS. 19A–B show the use of an AFGA with certain generic types of sensors.
Figure 19B:
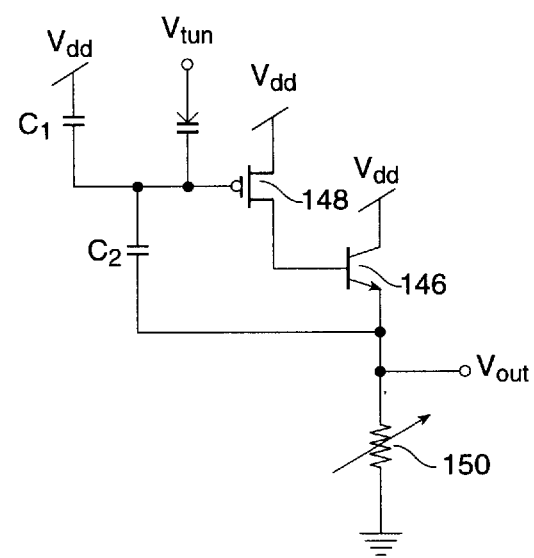

FIGS. 19A–B show the use of an AFGA with certain generic types of sensors. Since many sensors transduce a signal as a fractional change in their resistance, in many cases, the baseline resistance may vary from sensor to sensor or over time within the same sensor. Placing such a sensor 142 between the drain of an autozeroing pFET 144 and ground as depicted in FIG. 19A results in a circuit that transduces a given percentage change in the sensor's resistance into a transient output voltage of fixed amplitude. This amplitude can be set by changing the ratio $C_1/C_2$. Long-term drift in the baseline resistance of the sensor is adapted out by the circuit's autozeroing behavior. If the baseline sensor resistance is less than 1MΩ, the pFET will not be able to support the resulting current levels while remaining in its subthreshold (exponential) regime. In this case, an NPN transistor 146 may be inserted as shown in FIG. 19B where the subthreshold current in the pFET 148 is multiplied by the NPN transistor's current gain, β, to properly bias the sensor 150. Such devices are particularly well suited to smell-sensing and chemical sensing devices currently under development. Many such devices are based upon variable sensor resistance and experience drift over time.

Figure 20:
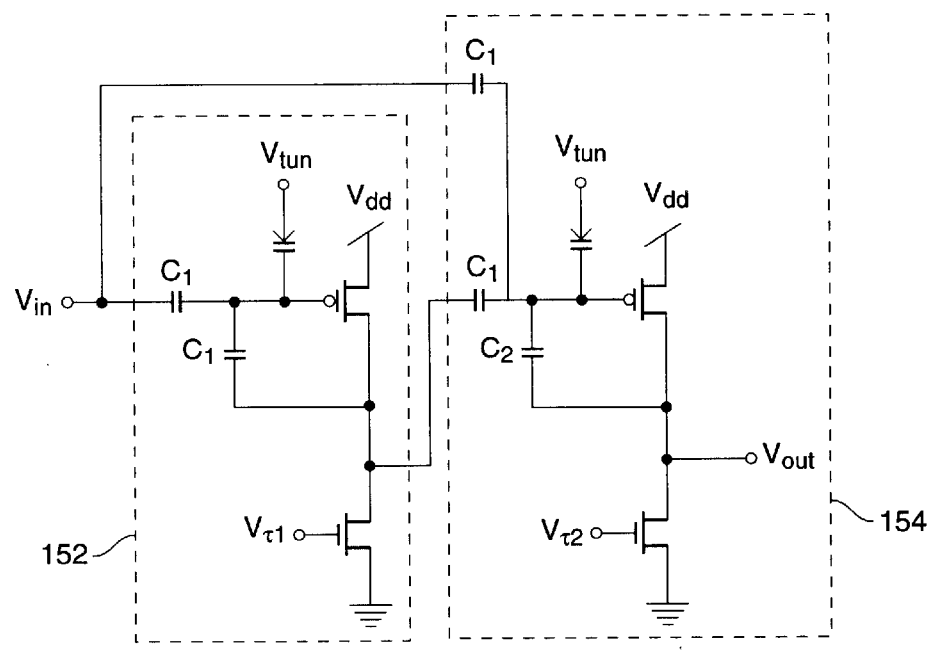
FIG. 20 depicts the circuit of an autozeroing differentiator.

FIG. 20 depicts the circuit of an autozeroing differentiator analogous to the "Diff1" circuit of C. Mead, *Analog VLSI and Neural Systems*, New York, Addison Wesley, 1989. The first AFGA 152 acts as an inverting loss-pass filter whose time-constant is set by $V_{\tau 1}$. The second AFGA 154 adds the input signal with the negative low-pass filtered output of the first AFGA 152 and multiplies the sum by a gain, $-C_1/C_2$. Thus, the output voltage, $V_{out}$, is a scaled, high-pass-filtered version of the input voltage $V_{in}$. When used as a differentiator, $V_{\tau 2}$ is normally higher relative to ground than $V_{\tau 1}$ so that the second AFGA 154 does not low-pass filter the output. However, the circuit may be used as a band-pass filter by making $V_{\tau 2}$ comparable to $V_{\tau 1}$.

Figure 21:
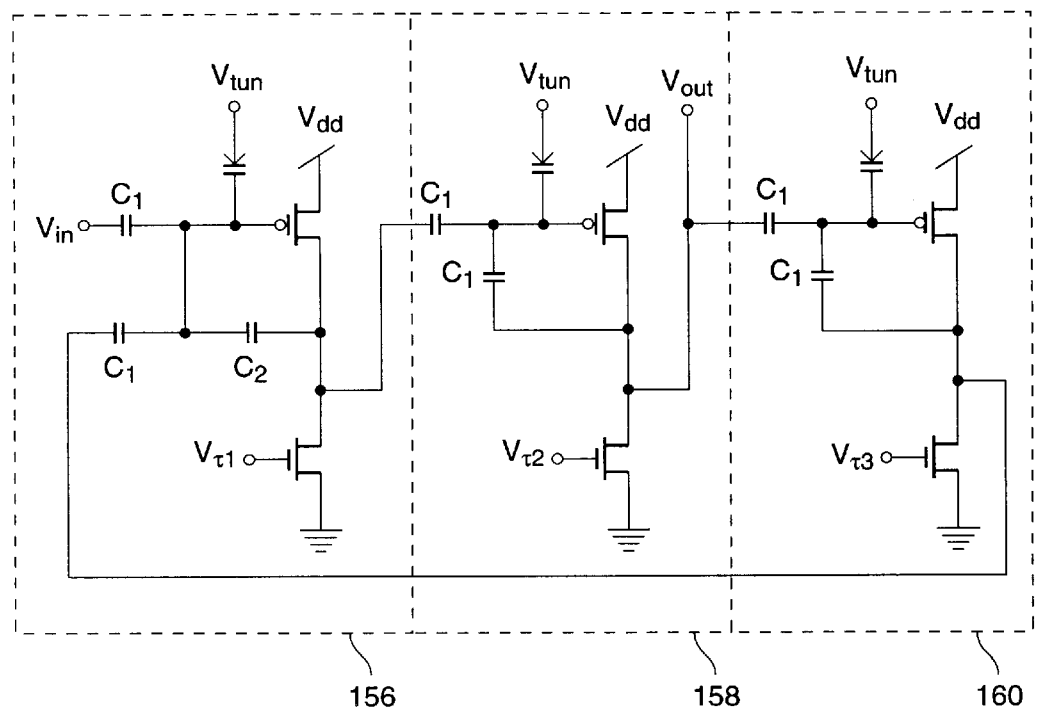
FIG. 21 depicts the circuit of a tunable, autozeroing second-order filter which can be cascaded to form silicon cochleas.

FIG. 21 depicts the circuit of a tunable, autozeroing second-order filter employing a first, second and third AFGA, 156, 158 and 160, respectively, which can be cascaded to form silicon cochleas. Normally bias voltage $V_{\tau 3}$ is set higher relative to ground than are bias voltages $V_{\tau 1}$ and $V_{\tau 2}$. The center frequency and quality factor of the filter are respectively set by the average and difference between $V_{\tau 1}$ and $V_{\tau 2}$.

Figure 22:
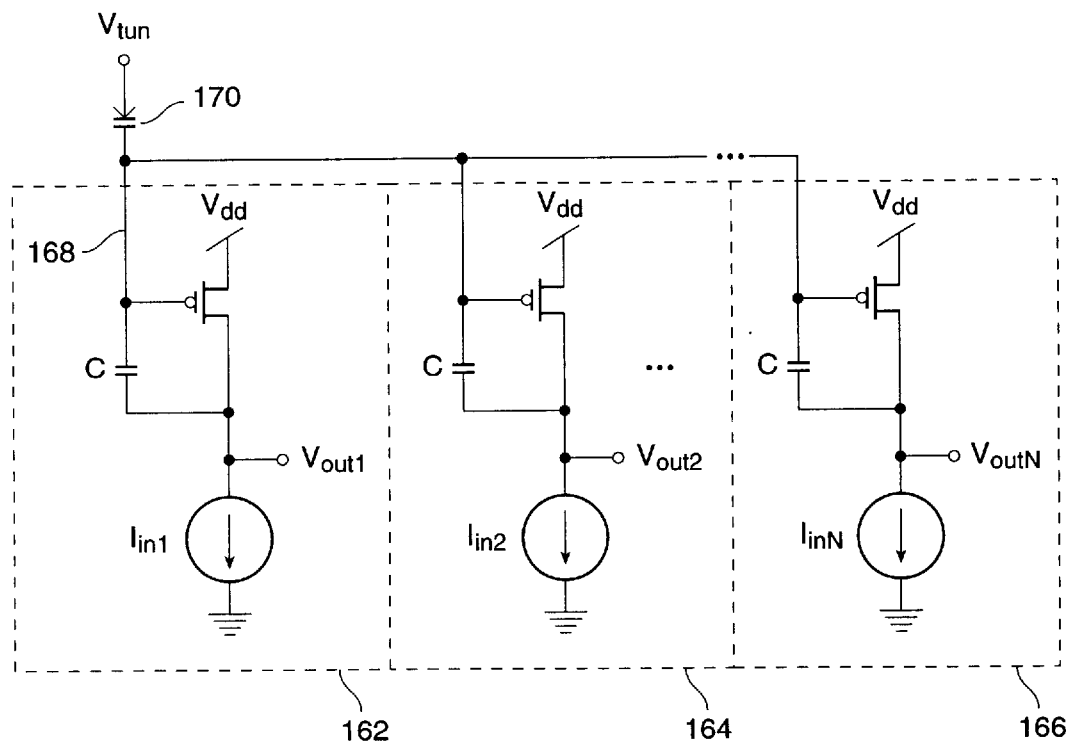
FIG. 22 depicts an autoranging winner-take-all (WTA) circuit.

FIG. 22 depicts an autoranging winner-take-all (WTA) circuit related to the current-mode max circuit described in B. A. Minch, C. Diorio, P. Hasler, and C. Mead, "A vMOS Soft-Maximum Current Mirror," *Proceedings of the* 1995 *International Symposium on Circuits and Systems*, Seattle, Wash., vol. 3, pp. 2249–2252. The circuit of FIG. 22 shows three stages, Stage 1 (162), Stage 2 (164) and Stage N (166). Many more stages could be placed between Stage 2 and Stage N if desired. The output voltage of the stage with the largest input current will be low whereas the rest of the output voltages will be at $V_{dd}$. The charge on the single floating gate 168 common to all stages governs the range of currents to which the circuit is sensitive. In this case, the autozeroing behavior adjusts the charge on the floating gate 168 so that the circuit adjusts its range to match the size of the largest current input. The tunneling current through tunneling junction 170 is balanced by an injection current at the drain of the pFET of the winning stage.

Figure 23:
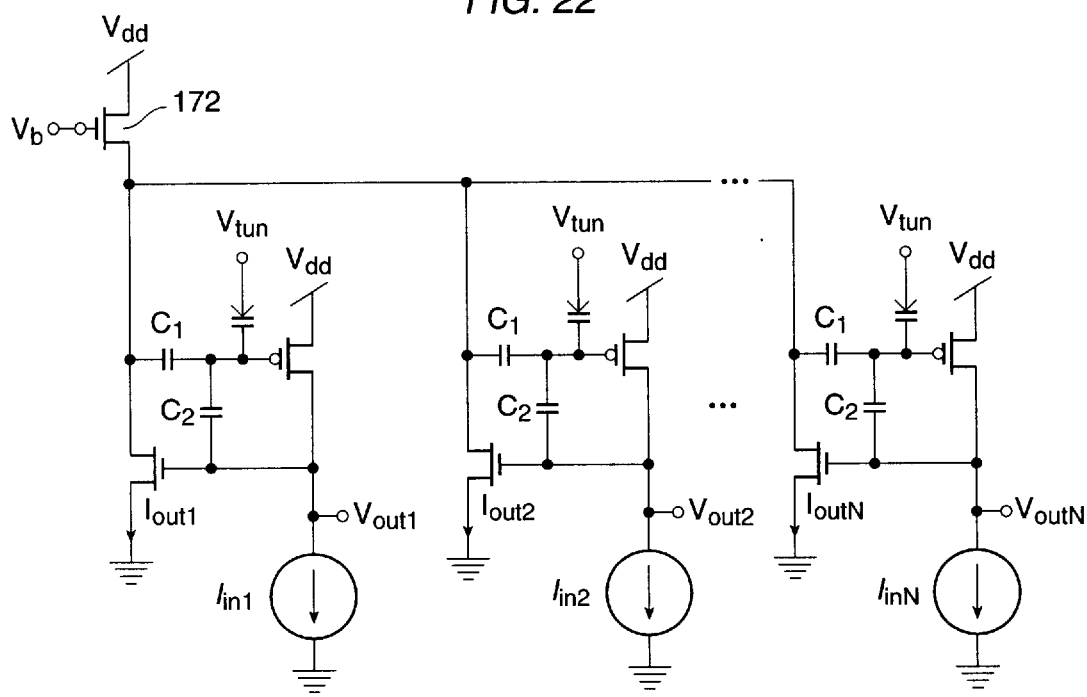
FIG. 23 depicts an autozeroing version of a WTA circuit.

FIG. 23 depicts an autozeroing version of the WTA circuit described in J. Lazzaro, S. Ryckebusch, M. A. Mahowald, and C. A. Mead, "Winner-Take-All Networks of O(N) Complexity," in D. S. Touretzky, ed., Advances in Neural Information Processing Systems 1, San Mateo, Calif.: Morgan Kaufmann, 1989, pp. 703–711. This is also an N-stage device with Stages 1, 2 and N shown. The outputs may be taken as either voltages or currents. In this circuit, $V_b$ is used to set the current flow through pFET 172 which, in turn, sets the total output current available for all N stages. The circuit transiently signals the location of the input making the largest change, making this a WTA circuit with a "conscience". This circuit may find application in attentive sensory processing.

Figure 24A:
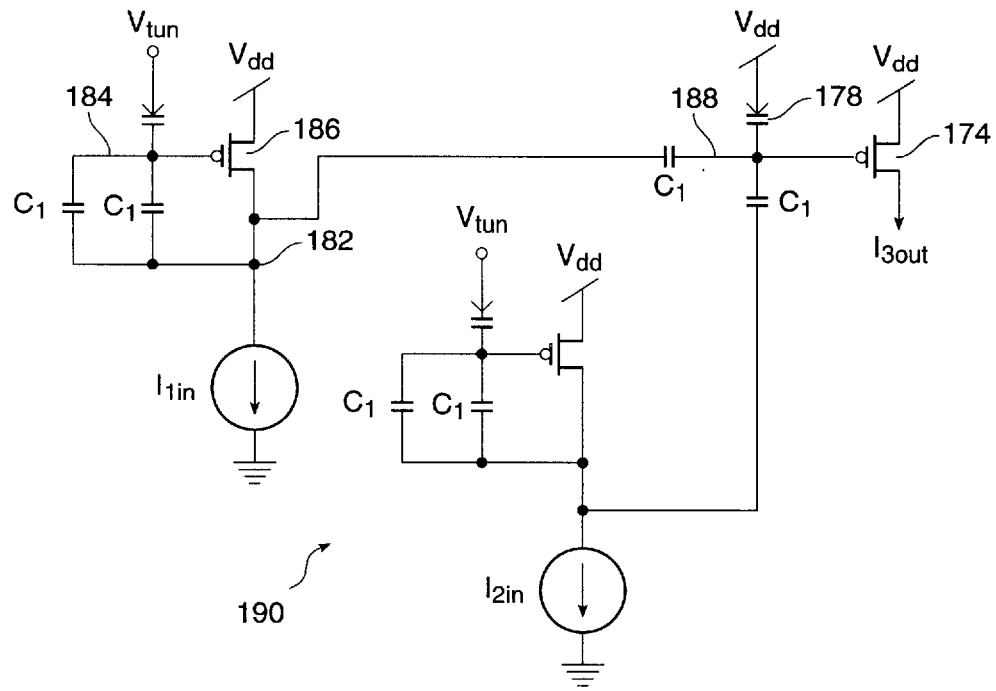
FIGS. 24A–B depict autozeroing floating-gate MOS translinear circuits.
Figure 24B:
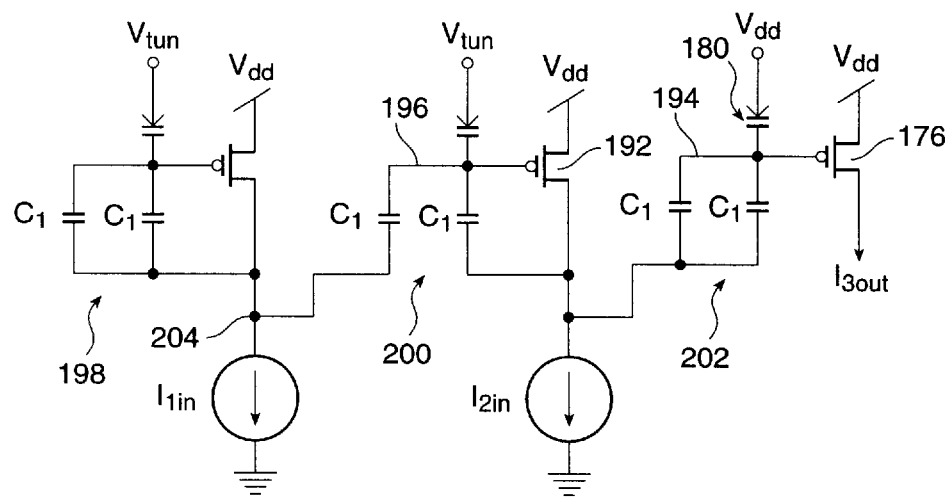

FIGS. 24A–B depict two examples of autozeroing floating-gate MOS translinear circuits, See B. A. Minch, C. Diorio, P. Hasler, and C. Mead, "Translinear Circuits Using Subthreshold Gloating-Gate MOS Circuits," *Analog Integrated Circuits and Signal Processing*, vol. 9, no. 2, 1996, pp. 167–179. FIG. 24A depicts an autozeroing geometric-mean circuit and FIG. 24B depicts an autozeroing squaring-quotient circuit. All capacitors shown have the same value, $C_1$.

Here, because a one-half power law is implemented, the drain voltage of the first input pFET at node 182 couples to the floating gate 184 of the input pFET 186 with twice the capacitance (i.e., two capacitors of value $C_1$) as it does to the floating gate 188 of the output pFET 174. The same is true for the second input AFGA 190.

In the circuit of FIG. 24B, a first AFGA 198, a second AFGA 200 and an output floating gate pFET 202 are used to implement a squaring power law and a minus-1 power law as in the relation $I_{3out} \sim I_{2in}^2/I_{1in}$. The drain voltage of the second input pFET 192 is coupled to the floating gate 194 of output pFET 176 with twice the capacitance as it is coupled to its own floating gate 196 to implement the squaring power law. First AFGA 198 couples to output floating gate pFET 202 through inverting unity gain AFGA 200 so as to implement the minus-1 power law. Here the drain 204 of AFGA 198 couples into its own floating gate with two capacitors of value $C_1$ while coupling into the floating gate 194 of the output floating gate pFET 176 through the same number of capacitors of value $C_1$.

In these circuits, the output current, $I_{3out}$, is proportional to the product of powers of the input currents $I_{1in}$ and $I_{2in}$. The constant of proportionality is changed by the autozeroing behavior on a slow timescale so that the output current returns to some baseline value. Care must be exercised with the output transistors; if the drain of an output transistor is held at a constant voltage (i.e., connected to a low-impedance load), the floating-gate voltage runs away. Consequently, for the circuits shown, the output pFETs 174, 176 do not autozero and their respective tunneling junctions 178, 180 are either omitted or biased so that no significant tunneling takes place.

Figure 25:
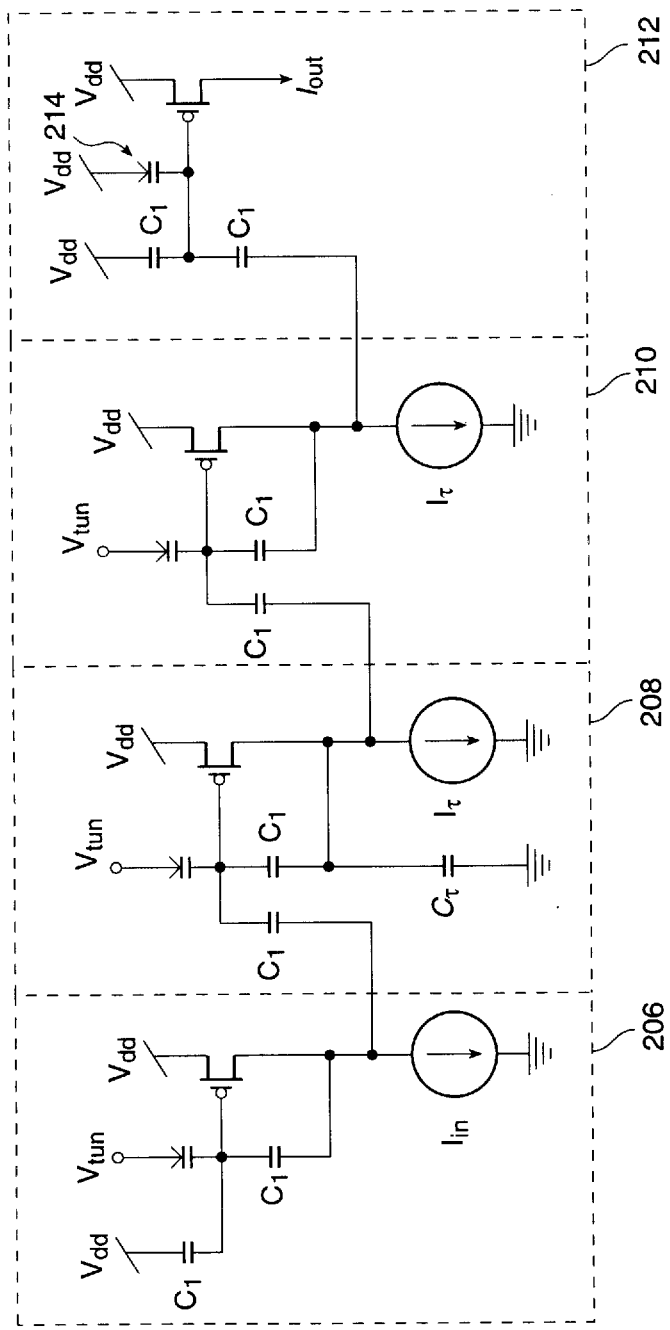
FIG. 25 depicts the circuit for an autozeroing first-order log-domain filter.

FIG. 25 depicts a circuit for an autozeroing first-order log-domain filter. Log-domain filters are discussed, for example, in D. R. Frey, "Log-Domain Filtering: An Approach to Current-Mode Filtering," *IEEE Proceedings-G*, vol. 140, no. 6, 1993, pp. 406–416. The circuit includes three stages of AFGAs 206, 208, 210 and an output floating gate pFET 212. All capacitors from drains to floating-gates have the same value and should be substantially smaller than $C_\tau$, which has a value preferably about ten times that of $C_1$. The output current $I_{out}$ is a large-signal-linear, first-order, low-pass-filtered version of the input current $I_{in}$. The time constant of the filter is proportional to $C_\tau U_T/I_\tau$. In this case, the autozeroing behavior adapts the gain of the filter on a slow timescale so that the DC component of the output current remains nearly fixed despite changes in the DC level of the input current $I_{in}$. Again, care must be exercised with the output stage 212; if the drain of the output stage is held at a constant voltage (i.e., connected to a low-impedance load), the floating-gate voltage runs away. Consequently, for the circuit shown, the output pFET does not autozero and its tunneling junction 214 is either omitted or biased so that no significant tunneling takes place.

Summary

The AFGA is a simple example of a wide class of adaptive floating-gate MOS circuits; each of these circuits uses tunneling and hot-electron injection to modulate the charge on floating gates to return the circuit to a baseline condition on a slow timescale. When the appropriate choice of feedback is applied to the floating gate, this adaptation is an inherent part of the circuit's operation-no additional control circuitry is required. In the case of AFGA, the feedback is set up so that the output voltage returns to its steady-state value on some long (selected) timescale. The modulation of the pFET hot-electron injection by the output voltage provides the correct feedback to return the output voltage to the proper operating regime.

The AFGA has four operating regimes that are similar for biases both above and below threshold. First, in the adaptation region, the AFGA behaves as a high-pass filter at low frequencies, where the timescale is set by the tunneling and injection currents. Second, in the integrating region, the AFGA behaves as a low-pass filter at high frequencies, where the timescale is set by the nFET bias current. Third, the AFGA acts as an amplifier for timescales between the adaptation and integrating regimes. Fourth, at frequencies much higher than the integrating behavior, the AFGA exhibits capacitive feedthrough, which can be reduced by an increase in either $C_W$ or $C_L$:

The AFGA is always a first-order system, even in the presence of parasitic capacitances; therefore, the AFGA is always stable, with 90 degrees of phase margin for noninductive loads. Any amplifier with resistive feedback is at least a second-order system, but an amplifier with capacitive feedback can be a first-order system. For moderate adaptation rates, the low-frequency time constant remains nearly constant, and any shift is due primarily to trapping in the tunneling oxide.

MOS devices and quantum processes, such as electron tunneling and hot-electron injection, are often criticized for their high $1/f$ noise. Since the AFGA's noise performance is similar in thermal and $1/f$ noise characteristics to that of a standard MOS amplifier, the tunneling and injection processes do not add appreciable noise to the amplifier. In addition, with a desired adaptation rate, the low-frequency noise generated in the AFGA can be significantly reduced; such a reduction cannot be obtained in a standard amplifier with a blocking capacitor at the input. The linear range of the AFGA can be increased by increasing $C_W$; the dynamic range of the AFGA can be increased by increasing $C_W$ or $C_L$.

Although illustrative presently preferred embodiments and applications of this invention are shown and described herein, many variations and modifications are possible which remain within the concept, scope, and spirit of the invention, and these variations would become clear to those of skill in the art after perusal of this application. The invention, therefore, is not to be limited except in the spirit of the appended claims.

What is claimed is:

1. An autozeroing floating gate apparatus, comprising:
   a signal input node;
   a signal output node;
   a reference ground set to a first voltage value;
   a power supply set to a second voltage value;
   a tunneling voltage node set to a third voltage value;
   a floating gate MOS transistor having a source, drain and floating gate, said source coupled to said power supply, said drain coupled to said signal output node;
   hot electron injection means for transporting electrons from said signal output node to said floating gate;
   tunneling means for removing electrons from said floating gate to said tunneling voltage node, said tunneling and injection means capable of operating simultaneously to establish an equilibrium state of the apparatus, said equilibrium state characterized by an equilibrium output voltage of said output node.

2. An autozeroing floating gate apparatus according to claim 1 wherein said floating gate MOS transistor is a pFET.

3. An autozeroing floating gate apparatus according to claim 1, further comprising: a first capacitor coupling said signal input node to said floating gate.

4. An autozeroing floating gate apparatus according to claim 3, further comprising: a second capacitor coupling said signal output node to said floating gate.

5. An autozeroing floating gate apparatus according to claim 4, further comprising a third capacitor coupling said floating gate to said power supply.

6. An autozeroing floating gate apparatus according to claim 5, further comprising a current source coupling said signal output node to said reference ground, the magnitude of electrical current passing through said current source controlled by a bias voltage source set to a fourth voltage value.

7. An autozeroing floating gate apparatus according to claim 6 wherein said current source is a MOS transistor and said bias voltage source is coupled to a gate of said MOS transistor.

8. An autozeroing floating gate amplifier, comprising:
   a signal input node;
   a signal output node;
   a reference ground set to a first voltage value;
   a power supply set to a second voltage value;
   a tunneling voltage node set to a third voltage value;
   a floating gate pFET MOS transistor having a source, drain and floating gate, said source coupled to said power supply, and said drain coupled to said signal output node;
   hot electron injection means for transporting electrons from said signal output node to said floating gate;
   tunneling means for removing electrons from said floating gate to said tunneling voltage node;
   a first capacitor coupling said signal input node to said floating gate;
   a second capacitor coupling said signal output node to said floating gate;
   a third capacitor coupling said floating gate to said reference ground; and
   a current source nFET MOS transistor having a source, gate and drain, said nFET source coupled to said reference ground, said nFET drain coupled to said signal output node and said nFET gate coupled to a bias voltage source, said third voltage value having a value in the range of about +33 DC volts to about +42 DC volts relative to said first voltage value and said second voltage value having a value in the range of about +6 DC volts to about +12 DC volts relative to said first voltage value.

9. A method for creating an autozeroing response in an electrical circuit including a floating gate element, said method comprising the steps of:
   using a hot electron injection process to transport electrons onto the floating gate at a first current;
   using a Fowler-Nordheim tunneling process to simultaneously remove electrons from the floating gate at a second current;
   disturbing a state of equilibrium, wherein said first current and said second current are equal, with an input signal causing said first current and said second current to be unequal; and
   controlling a rate of said hot electron injection process and/or a rate of said Fowler-Nordheim tunneling process so as to reduce the inequality between said first current and said second current.

10. A method according to claim 9, wherein said inequality between said first current and said second current will achieve a stable equilibrium value after a period of time determined by circuit components of the electrical circuit in response to an input signal within a frequency range determined by circuit components of the electrical circuit.

11. A method according to claim 10, wherein said first current and said second current of electrons are equal when said stable equilibrium value is achieved.

12. A method for creating an autozeroing response in an electrical circuit including a floating gate, an input node capacitively coupled to said floating gate, and an output node capacitively coupled to said floating gate, said method comprising the steps of:

using a hot electron injection process to cause a current $J_1$ of electrons to be transported onto the floating gate;

using a Fowler-Nordheim tunneling process to cause a current $J_2$ of electrons to be transported off of the floating gate, said hot electron injection process and said Fowler-Nordheim tunneling process capable of occurring simultaneously to establish an equilibrium voltage on said output node;

controlling $J_1$ with an input signal applied to the input node; and causing an output signal on the output node to tend toward a stable equilibrium by increasing $J_1$ when $J_2$ increases and decreasing $J_1$ when $J_2$ decreases.

13. A method according to claim 12 further comprising the step of:

controlling $J_2$ with a tunneling voltage source applied to a tunneling junction coupled through said Fowler-Nordheim tunneing process to the floating gate.

14. An autozeroing sensor apparatus, comprising a variable current sensor which varies current passed between a first node and a second node in response to sensed activity, said first node coupled to a reference ground at a first voltage value and said second node coupled to an output node;

a floating-gate MOS transistor having a source, floating gate and a drain, said drain coupled to said output node and said source coupled to a power supply set to a second voltage;

means for hot electron injection of electrons onto said floating gate;

a capacitor coupling said floating fate to said power supply;

a second capacitor coupling said floating fate to said output node; and a Fowler-Nordheim tunneling junction coupled to said floating gate for removing electrons therefrom, said tunneling junction operating simultaneously with said hot electron injection means to establish an equilibrium state of the apparatus, said equilibrium state characterized by an equilibrium output voltage of said output node.

15. An autozeroing sensor apparatus according to claim 14 wherein said MOS transistor is a pFET and said first voltage value is less than said second voltage value.

16. An autozeroing sensor apparatus, comprising:

a variable resistance sensor element which varies an electrical resistance between a first node and a second node in response to sensed activity and which experiences drift over periods of time exceeding the periods of time in which sensed activity takes place, said first node coupled to a reference ground at a first voltage value, said second node coupled to an output node;

a floating-gate MOS transistor having a source, a drain, and a floating gate, said drain coupled to said output node, said source coupled to a power supply at a second voltage value;

means for hot-electron injection of electrons onto said floating gate;

said power supply capacitively coupled to said floating gate;

said output node capacitively coupled to said floating gate; and a Fowler-Nordheim tunneling junction coupled to said floating gate for removing electrons therefrom, said tunneling junction operating simultaneously with said hot electron injection means to establish an equilibrium state of the apparatus, said equilibrium state characterized by an equilibrium output voltage of said output node.

17. An autozeroing sensor apparatus according to claim 16 wherein said MOS transistor is a pFET and said first voltage value is less than said second voltage value.

18. An autozeroing sensor apparatus, comprising:

a MOS transistor having a floating gate, a source, and a drain;

means for hot electron injection of electrons onto said floating gate;

means for Fowler-Nordheim tunneling of electrons off of said floating gate, said Fowler Nordheim tunneling means and said hot electron injection means operating simultaneously to establish an equilibrium state of said floating gate; and a sensor element having a first node and a second node, said first node connected to a reference ground set to a first voltage level, said second node connected to an output node, said output node capacitively coupled to said floating gate, said sensor element having an electrical characteristic measurable between said first and second nodes, which varies in response to a sensed activity.

19. Apparatus according to claim 18, wherein said drain is coupled to said output node.

20. Apparatus according to claim 19 wherein said sensor is variable in current in response to sensed activity.

21. Apparatus according to claim 18, wherein said drain is coupled to a base of an NPN transistor and an emitter of said NPN transistor is coupled to said output node.

22. Apparatus according to claim 21 wherein said sensor is variable in resistance in response to sensed activity.

23. An autozeroing winner-take-all circuit, comprising:

a first MOS transistor having a first floating gate, a first source and a first drain;

first means for hot electron injection of electrons onto said first floating gate;

first means for Fowler-Nordheim tunneling of electrons off of said first floating gate;

a second MOS transistor having a second floating gate, a second source and a second drain;

second means for hot electron injection of electrons onto said second floating gate;

second means for Fowler-Nordheim tunneling of electrons off of said second floating gate;

said first and second source connected to a power supply set to a first DC voltage level;

said first drain coupled to a first output node and capacitively coupled to said first floating gate;

said second drain coupled to a second output node and capacitively coupled to said second floating gate;

a first input current source coupled between said first output node and a second power supply set to a second DC voltage level less than said first DC voltage level; and a second input current source coupled between said second output node and said second power supply.

24. An autozeroing winner-take-all circuit according to claim 23 wherein said first and second MOS transistors are pFETs.

25. An autozeroing winner-take-all circuit according to claim 23 wherein the circuit is adapted to cause a signal on one of said output nodes to drop to a voltage value between said first DC voltage value and said second DC voltage value and closer to said second DC voltage value than to said first DC voltage value when its corresponding input current source has a larger current passing through it than all other input current sources in the circuit.

26. An autozeroing winner-take-all circuit according to claim 25 wherein said first and second MOS transistors are pFETs.

27. An autozeroing winner-take-all circuit, comprising:

a first pFET MOS transistor having a first floating gate, a first source and a first drain;

first means for hot electron injection of electrons onto said first floating gate;

first means for Fowler-Nordheim tunneling of electrons off of said first floating gate;

a second pFET MOS transistor having a second floating gate, a second source and a second drain;

second means for hot electron injection of electrons onto said second floating gate;

second means for Fowler-Nordheim tunneling of electrons off of said second floating gate;

a third pFET MOS transistor having a third gate, a third source and a third drain;

a fourth pFET MOS transistor having a fourth gate, a fourth source and a fourth drain;

said first and second sources connected to a first power supply set to a first DC voltage level;

said first and second drain connected, respectively, to a first and second voltage output node;

said first voltage output node connected to said third gate and capacitively coupled to said first floating gate;

said second voltage output node connected to said fourth gate and capacitively coupled to said second floating gate;

said third source connected to a first circuit node and capacitively coupled to said first floating gate;

said fourth source connected to said first circuit node and capacitively coupled to said second floating gate;

a first input current source coupled between said first voltage output node and a second power supply set to a second DC voltage level less than said first DC voltage level;

a second input current source coupled between said second voltage output node and said second power supply; and a fifth pFET MOS transistor having a fifth gate, a fifth source and a fifth drain, said fifth source connected to said first power supply, said fifth gate connected to a bias voltage supply for setting a total current to be passed by said fifth pFET MOS transistor, and a drain connected to said first circuit node.

28. An autozeroing geometric mean floating gate MOS translinear circuit, comprising:

a first pFET MOS transistor having a first floating gate, a first source and a first drain;

first means for hot electron injection of electrons onto said first floating gate;

first means for Fowler-Nordheim tunneling of electrons off of said first floating gate;

a second pFET MOS transistor having a second floating gate, a second source and a second drain;

second means for hot electron injection of electrons onto said second floating gate;

second means for Fowler-Nordheim tunneling of electrons off of said second floating gate;

a third pFET MOS transistor having a third floating gate, a third source and a third drain;

said first, second and third sources connected to a first power supply set to a first DC voltage level;

a first input current source coupled between said first drain and a second power supply set to a second DC voltage level less than said first DC voltage level;

a second input current source coupled between said second drain and said second power supply;

an output current source node connected to said third drain and said second power supply;

said first drain capacitively coupled to said first floating gate and said third floating gate; and said second drain capacitively coupled to said second floating gate and said third floating gate.

29. An autozeroing geometric mean floating gate MOS translinear circuit according to claim 28 wherein the capacitance between said first drain and said first floating gate is equal to the capacitance between said second drain and said second floating gate which is double the capacitance between said second drain and said third floating gate and said first drain and said third floating gate.

30. An autozeroing squaring-quotient floating gate MOS translinear circuit, comprising:

a first pFET MOS transistor having a first floating gate, a first source and a first drain;

first means for hot electron injection of electrons onto said first floating gate;

first means for Fowler-Nordheim tunneling of electrons off of said first floating gate;

a second pFET MOS transistor having a second floating gate, a second source and a second drain;

second means for hot electron injection of electrons onto said second floating gate;

second means for Fowler-Nordheim tunneling of electrons off of said second floating gate;

a third pFET MOS transistor having a third floating gate, a third source and a third drain;

said first, second and third sources connected to a first power supply set to a first DC voltage level;

a first input current source coupled between said first drain and a second power supply set to a second DC voltage level less than said first DC voltage level;

a second input current source coupled between said second drain and said second power supply;

said first drain capacitively coupled to said first floating gate and said second floating gate;

said second drain capacitively coupled to said second floating gate and said third floating gate; and an output current source node connected to said third drain.

31. An autozeroing squaring-quotient floating gate MOS translinear circuit according to claim 30 wherein the capacitance between said first drain and said first floating gate is the same as the capacitance between said second drain and said third floating gate which is twice the capacitance between said second drain and said second floating gate and between said first drain and said second floating gate.

* * * * *

UNITED STATES PATENT AND TRADEMARK OFFICE
CERTIFICATE OF CORRECTION

PATENT NO. : 5,875,126
DATED : February 23, 1999
INVENTOR(S) : Bradley A. Minch, Paul S. Hasler, Christopher J. Diorio, and Carver A. Mead It is certified that error appears in the above-identified patent and that said Letters Patent is hereby corrected as shown below:

On the title page, item [56]:

In the References:

In the first C. Diorio cite please replace "Transistor MOS" with --Transistor Silicon MOS--.

In the Y. Lebleici cite please replace "Hot Carrier." with --Hot Carrier--.

On column 2, line 25, replace "bidirectional" with --bi-directional--.

On column 5, line 7, replace "5 V" with --5V--.

On column 7, line 3-4, replace "33 V" with --33V--.

On column 7, line 4, replace "42 V" with --42V--.

On column 7, line 4, replace "6 V and 12 V" with --6V and 12V--.

UNITED STATES PATENT AND TRADEMARK OFFICE
CERTIFICATE OF CORRECTION

PATENT NO. : 5,875,126

DATED : February 23, 1999

INVENTOR(S) : Bradley A. Minch, Paul S. Hasler, Christopher J. Diorio, and Carver A. Mead It is certified that error appears in the above-identified patent and that said Letters Patent is hereby corrected as shown below:

On column 7, line 7, replace "26 V and 31 V" with --26V and 31V--.

On column 7, line 7, replace "modem" with --modem--.

On column 7, line 55, replace "region," with --region--.

On column 7, line 60, replace "3.0 V" with --3.0V--.

On column 7, line 61, replace "8.5 V" with --8.5V--.

On column 8, line 5, replace "0.75 V/nm" with --0.75V/nm--.

On column 8, line 6, replace "1.0 V/nm" with --1.0V/nm--.

On column 8, line 16, replace "25.6 V/nm" with --25.6V/nm--.

On column 8, line 33, replace "1 V" with --1V--.

On column 8, line 63, replace "200 nA, 49 nA, 9 nA, 5 nA" with --200nA, 49nA, 9nA, 5nA--.

On column 9, line 2, replace "2 V" with --2V--.

On column 9, line 9, replace "8.2 V" with --8.2V--.

UNITED STATES PATENT AND TRADEMARK OFFICE
CERTIFICATE OF CORRECTION

PATENT NO. : 5,875,126
DATED : February 23, 1999
INVENTOR(S) : Bradley A. Minch, Paul S. Hasler, Christopher J. Diorio, and Carver A. Mead It is certified that error appears in the above-identified patent and that said Letters Patent is hereby corrected as shown below:

On column 9, line 9, replace "250 mV" with --250mV--.

On column 9, line 34, replace "250 mV" with --250mV--.

On column 10, line 10, replace "$\Delta V_{96}$" with --$\Delta V_\tau$--.

On column 10, line 46, replace "36.35 V, 36.9 V" with --36.35V, 36.9V--.

On column 11, line 4, replace "64 dB" with --64dB--.

On column 11, line 7, replace "0 dB" with --0dB--.

On column 11, line 40, after "-1", insert a --)--.

On column 11, line 64, replace "10 mV" with --10mV--.

On column 12, line 42, replace "closed-oop" with --closed-loop--.

On column 12, line 62, replace "X(0+)" with --$X(0^+)$--.

On column 13, line 39, replace "50 $f$A" with --50$f$A--.

On column 13, line 41, replace "41 V, 40.5 V, 40 V, 39.5 V" with --41V, 40.5V, 40V, 39.5V--.

UNITED STATES PATENT AND TRADEMARK OFFICE
CERTIFICATE OF CORRECTION

PATENT NO. : 5,875,126
DATED : February 23, 1999
INVENTOR(S) : Bradley A. Minch, Paul S. Hasler, Christopher J. Diorio, and Carver A. Mead It is certified that error appears in the above-identified patent and that said Letters Patent is hereby corrected as shown below:

On column 14, line 59, between EQ. 30 and EQ. 31, insert --where $\tau_{h2}$ is defined to be:--.

On column 15, line 18-19, replace "300 $f$F" with --300$f$F--.

On column 15, line 19, replace "50 $f$F" with --50$f$F--.

On column 15, line 31, replace "responses," with --responses--.

On column 15, line 31, replace "step," with --step--.

On column 16, line 55, replace "26 dB" with --26dB--.

On column 18, line 23, replace "13A-3B" with --13A-13B--.

On column 18, line 24, replace "fixed. voltage" with --fixed voltage--.

On column 20, line 58, after "$_4$_ insert --($0^+$)--, to read as follows:

$$\Delta \overline{V_{out}} = V_{inj} \ln \left( Q + \left( e^{\frac{\hat{V}_{out}(0^+)}{V_{inj}}} - Q \right) e^{-\frac{1}{\tau}} \right)$$

UNITED STATES PATENT AND TRADEMARK OFFICE
CERTIFICATE OF CORRECTION

PATENT NO. : 5,875,126

DATED : February 23, 1999

INVENTOR(S) : Bradley A. Minch, Paul S. Hasler, Christopher J. Diorio, and Carver A. Mead It is certified that error appears in the above-identified patent and that said Letters Patent is hereby corrected as shown below:

On column 20, line 60, delete "-1", and the equation so the equation will read as follows:

$$\Delta \overline{V_{out}} = V_{inj} \ln\left(E\left(e^{-\frac{\Delta \hat{V}_{out}}{V_{inj}}}\right)\right)$$

On column 21, line 2, replace "·t" with --ωt--.

On column 22, line 62-63, replace "HotElectron-Induced" with --Hot-Electron-Induced--.

On column 23, line 7, replace "5 V" with --5V--.

On column 23, line 47, replace "cm⁻" with --$cm^{-3}$--.

On column 27, line 1, replace "-" with -- -- --.

On column 27, line 61, replace "gate;" with --gate; and--.

On column 29, line 48, replace "fate" with --gate--.

UNITED STATES PATENT AND TRADEMARK OFFICE
CERTIFICATE OF CORRECTION

PATENT NO. : 5,875,126
DATED : February 23, 1999
INVENTOR(S) : Bradley A. Minch, Paul S. Hasler, Christopher J. Diorio, and Carver A. Mead It is certified that error appears in the above-indentified patent and that said Letters Patent is hereby corrected as shown below:

On column 29, line 50, replace "fate" with --gate--.

Signed and Sealed this

Thirtieth Day of November, 1999

Q. TODD DICKINSON

Attest:

Attesting Officer

Acting Commissioner of Patents and Trademarks